United States Patent
Tajima

(10) Patent No.: US 11,978,806 B2
(45) Date of Patent: May 7, 2024

(54) SEMICONDUCTOR DEVICE AND SEMICONDUCTOR STORAGE DEVICE

(71) Applicant: KIOXIA CORPORATION, Tokyo (JP)

(72) Inventor: Hikari Tajima, Mitaka Tokyo (JP)

(73) Assignee: Kioxia Corporation, Tokyo (JP)

( * ) Notice: Subject to any disclaimer, the term of this patent is extended or adjusted under 35 U.S.C. 154(b) by 310 days.

(21) Appl. No.: 17/410,057

(22) Filed: Aug. 24, 2021

(65) Prior Publication Data

US 2022/0302311 A1   Sep. 22, 2022

(30) Foreign Application Priority Data

Mar. 22, 2021 (JP) ................. 2021-047615

(51) Int. Cl.
*H01L 29/24* (2006.01)
*H01L 27/108* (2006.01)
(Continued)

(52) U.S. Cl.
CPC .......... *H01L 29/7869* (2013.01); *H01L 28/65* (2013.01); *H01L 29/24* (2013.01); *H10B 12/02* (2023.02); *H10B 12/30* (2023.02)

(58) Field of Classification Search
CPC ......... H01L 28/65; H01L 28/60; H01L 28/75; H01L 28/90; H01L 29/7869; H01L 29/24;
(Continued)

(56) References Cited

U.S. PATENT DOCUMENTS 6,995,417 B2   2/2006 Yamazaki et al.
9,698,272 B1 *  7/2017 Ikeda ................ H01L 29/78642
(Continued)

FOREIGN PATENT DOCUMENTS

JP        3906215 B2    4/2007
JP     2007-221156 A    8/2007
(Continued)

OTHER PUBLICATIONS

U.S. Appl. No. 17/006,617.
(Continued)

*Primary Examiner* — Nikolay K Yushin
(74) *Attorney, Agent, or Firm* — Kim & Stewart LLP

(57) ABSTRACT

A semiconductor device includes a semiconductor layer including first and second regions and a third region therebetween, a gate insulating layer between the third region and a gate electrode, first and second electrodes connected to the first and second regions in a first direction, a first conductive layer between the first region and the first electrode and/or between the second region and the second electrode. The first conductive layer includes a metal element, aluminum, and nitrogen, and has first and second portions. An atomic concentration of the metal element is higher than that of aluminum in the first portion. An atomic concentration of aluminum is higher than that of the metal element in the second portion. The device further includes a second conductive layer between the oxide semiconductor layer and the first conductive layer. The second conductive layer includes oxygen and at least one of indium, zinc, tin, and cadmium.

20 Claims, 13 Drawing Sheets

(51) Int. Cl.
*H01L 29/786* (2006.01)
*H01L 49/02* (2006.01)
*H10B 12/00* (2023.01)

(58) Field of Classification Search
CPC ............ H01L 29/786; H01L 29/78606; H01L 29/66969; H01L 29/66; H01L 29/78693; H01L 29/78642; H10B 12/30; H10B 12/02; H10B 12/05; H10B 12/31; H10B 12/00; H10B 12/33
See application file for complete search history.

(56) References Cited

U.S. PATENT DOCUMENTS

| | | | |
|---|---|---|---|
| 2005/0087788 | A1 | 4/2005 | Kutsunai et al. |
| 2008/0073680 | A1 | 3/2008 | Wang |
| 2008/0121956 | A1 | 5/2008 | Kanaya |
| 2010/0124821 | A1 | 5/2010 | Marsh |
| 2016/0306084 | A1* | 10/2016 | Padiyath .................. G02B 1/11 |
| 2019/0279932 | A1 | 9/2019 | Wakatsuki et al. |
| 2020/0381557 | A1 | 12/2020 | Hattori et al. |

FOREIGN PATENT DOCUMENTS

| | | | | |
|---|---|---|---|---|
| JP | 2008-078390 A | 4/2008 | | |
| JP | 2008-135648 A | 6/2008 | | |
| JP | 2008-270313 | * 11/2008 | ............ | H01L 27/10 |
| JP | 2011-124447 A | 6/2011 | | |
| JP | 2019-160918 A | 9/2019 | | |
| TW | 201027626 A | 7/2010 | | |
| TW | 202103321 A | 1/2021 | | |
| WO | 2020/194116 A1 | 10/2020 | | |

OTHER PUBLICATIONS

U.S. Appl. No. 17/198,673.
V. Chawla et al., "Effect of phase transformation on structural, electrical and hydrophobic properties of nanocomposite Ti1-xAlxN films" Nano Science Laboratory, Institute Instrumentation Centre, Indian Institute of Technology Roorkee, Roorkee 247667, India, Department of Metallurgical and Materials Engineering & Centre of Nanotechnology, Indian Institute of Technology Roorkee, Roorkee 247667, India, Journal of Alloys and Compounds 507 (2010) L47-L53.
V. Chawla et al., "Effect of phase transformation on structural, electrical and hydrophobic properties of nanocomposite Ti1-xAlxN films" Nano Science Laboratory, Institute Instrumentation Centre, Indian Institute of Technology Roorkee, Roorkee 247667, India, Department of Metallurgical and Materials Engineering & Centre of Nanotechnology, Indian Institute of Technology Roorkee, Roorkee 247667, India, Journal of Alloys and Compounds 507 (2010) L47-L53 (7 pages).

* cited by examiner

SEMICONDUCTOR DEVICE AND SEMICONDUCTOR STORAGE DEVICE

CROSS-REFERENCE TO RELATED APPLICATION

This application is based upon and claims the benefit of priority from Japanese Patent Application No. 2021-047615, filed Mar. 22, 2021, the entire contents of which are incorporated herein by reference.

FIELD

Embodiments described herein relate generally to a semiconductor device and a semiconductor storage device.

BACKGROUND

An oxide semiconductor transistor that forms a channel in an oxide semiconductor layer has an excellent characteristic that the channel leakage current (the current which flows even when the transistor is turned off), is extremely small. Therefore, it has been considered to use such an oxide semiconductor transistor as a switching transistor of a memory cell for a Dynamic Random Access Memory (DRAM).

However, when an oxide semiconductor transistor is used as a switching transistor of a memory cell, the oxide semiconductor transistor must undergo heat treatment(s) associated with the fabrication of the memory cell and wiring. Therefore, an oxide semiconductor transistor having high heat resistance is required for such uses. Furthermore, little fluctuation in characteristics of such an oxide semiconductor even after heat treatment(s) would be desirable.

DETAILED DESCRIPTION

Figure 1:
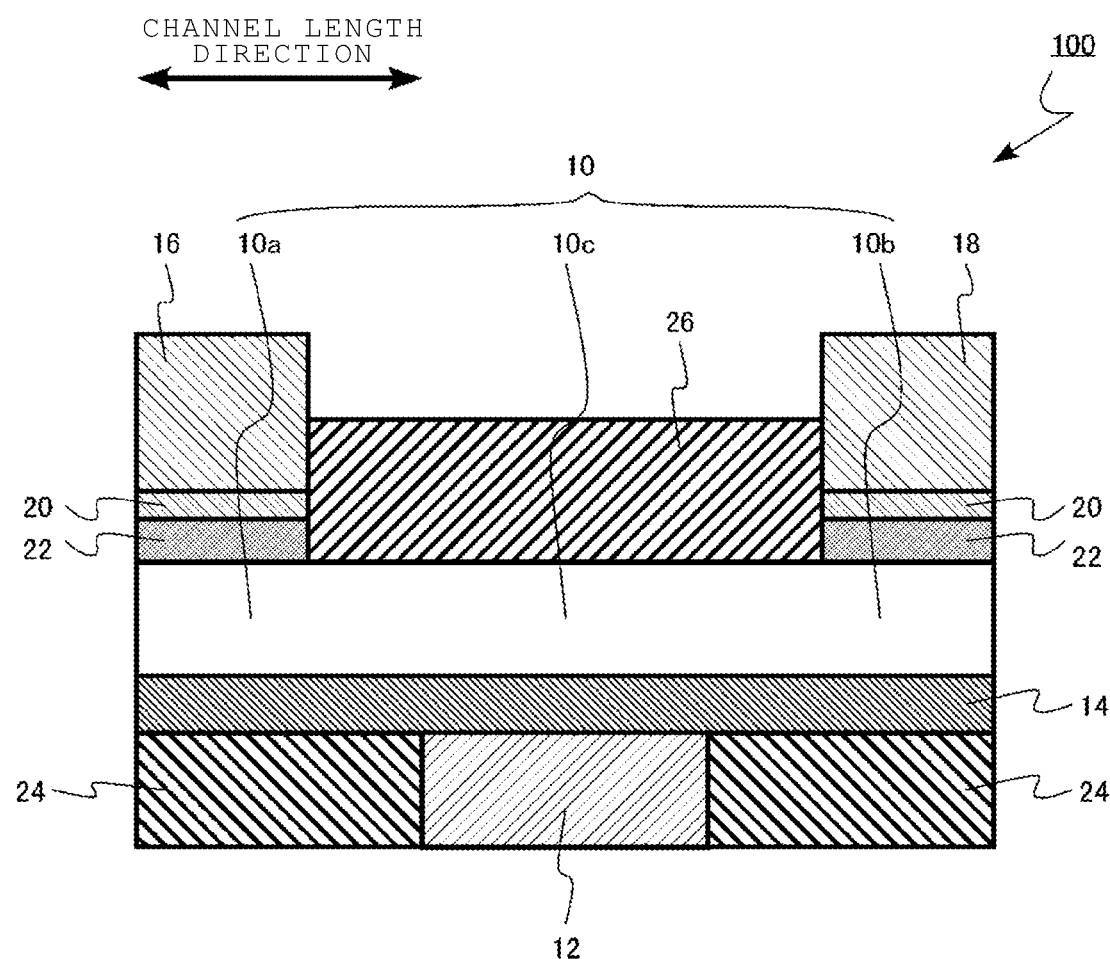
FIG. 1 is a schematic cross-sectional view of a semiconductor device of a first embodiment.

Embodiments provide a semiconductor device having high heat resistance.

In general, according to one embodiment, a semiconductor device includes an oxide semiconductor layer having a first region, a second region, and a third region between the first region and the second region. A gate insulating layer is between the third region and a gate electrode. A first electrode is electrically connected to the first region from a first direction. A second electrode is electrically connected to the second region from the first direction. A first conductive layer is between the first region and the first electrode and/or between the second region and the second electrode. The first conductive layer includes aluminum (Al), nitrogen, and at least one metal element selected from a group consisting of titanium (Ti), vanadium (V), zirconium (Zr), niobium (Nb), and chromium (Cr). The first conductive layer has a first portion and a second portion adjacent to the first portion in the first direction. An atomic concentration of the at least one metal element in the first portion is higher than an atomic concentration of aluminum in the first portion, and an atomic concentration of aluminum in the second portion is higher than an atomic concentration of the at least one metal element in the second portion. The device further includes a second conductive layer that is between the oxide semiconductor layer and the first conductive layer. The second conductive layer includes oxygen and at least one element selected from a group consisting of indium (In), zinc (Zn), tin (Sn), and cadmium (Cd).

Hereinafter, certain example embodiments of the present disclosure will be described with reference to the drawings. In the following description, the same or similar members or aspects will be denoted by the same reference numerals and the description of repeated members or aspects will be omitted as appropriate from subsequent descriptions of drawings or examples.

Also, in this specification, the terms "upper" and "lower" may be used for convenience. "Upper" or "lower" is a term that indicates the relative positional relationship in the drawing and does not necessarily define the positional relationship with respect to gravity.

The qualitative analysis and quantitative analysis of the chemical composition of the portions of the semiconductor devices or the semiconductor storage devices in the present specification may be performed by, for example, a secondary ion mass spectroscopy (SIMS), an energy dispersive X-ray spectroscopy (EDX), Rutherford back-scattering spectroscopy (RBS), or electron energy-loss spectroscopy (EELS). Furthermore, the thickness of the portions of the semiconductor devices, the distance between the portions, the crystal grain size of materials, and the like may be measured using, for example, a transmission electron microscope (TEM).

First Embodiment

FIG. 1 is a schematic cross-sectional view of a semiconductor device of a first embodiment.

The semiconductor device of the first embodiment is a transistor 100. The transistor 100 is an oxide semiconductor transistor including an oxide semiconductor layer 10 in which a channel can be formed. The transistor 100 is a so-called bottom gate type transistor in which a gate electrode 12 is provided below the oxide semiconductor layer 10, and a source electrode 16 and a drain electrode 18 are provided on the oxide semiconductor layer 10. The transistor 100 is an n-channel transistor whose majority carrier is an electron.

As shown in FIG. 1, the transistor 100 includes an oxide semiconductor layer 10, a gate electrode 12, a gate insulating layer 14, a source electrode 16, a drain electrode 18, a barrier layer 20, a contact layer 22, a first insulating layer 24, and a second insulating layer 26.

The channel that serves as a current path when the transistor 100 is turned on is formed in the oxide semiconductor layer 10. The direction in which electrons flow in the channel is called a channel length direction. The channel length direction is indicated by double-headed arrows in FIG. 1.

The oxide semiconductor layer 10 is made of an oxide semiconductor. The oxide semiconductor layer 10 is, for example, made of a metal oxide. The oxide semiconductor layer 10 has, for example, an amorphous structure.

The oxide semiconductor layer 10 includes, for example, indium (In), zinc (Zn), and at least one of gallium (Ga) and aluminum (Al). The ratio of the total atomic concentration of indium, gallium, aluminum, and zinc to the total atomic concentration of the metal elements in the oxide semiconductor layer 10 is, for example, 90% or more. The ratio of the total atomic concentration of indium, gallium, aluminum, and zinc to the total atomic concentration of elements other than oxygen in the oxide semiconductor layer 10 is, for example, 90% or more. For example, in the oxide semiconductor layer 10, there is no individual element other than oxygen having an atomic concentration higher than any of indium, gallium, aluminum, or zinc.

The oxide semiconductor layer 10 includes a first region 10a, a second region 10b, and a third region 10c. The third region 10c is between the first region 10a and the second region 10b.

The oxide semiconductor layer 10 includes, for example, an oxygen-deficient region. The oxygen-deficient region in the oxide semiconductor layer 10 functions as a donor.

The thickness of the oxide semiconductor layer 10 is, for example, 10 nm to 100 nm.

The oxide semiconductor layer 10 is formed by, for example, an atomic layer deposition method (ALD method).

The gate electrode 12 is provided below the oxide semiconductor layer 10. The gate electrode 12 is made of, for example, a metal, a metal compound, or a semiconductor. The gate electrode 12 is made of, for example, titanium nitride (TiN) or tungsten (W). The gate length of the gate electrode 12 (i.e., the length of the gate electrode 12 in the channel length direction) is, for example, 20 nm to 100 nm.

The gate insulating layer 14 is provided between the oxide semiconductor layer 10 and the gate electrode 12. The gate insulating layer 14 is provided between the third region 10c and the gate electrode 12.

The gate insulating layer 14 is made of, for example, an oxide or an oxynitride. The gate insulating layer 14 is made of, for example, silicon oxide or aluminum oxide. The thickness of the gate insulating layer 14 is, for example, 2 nm to 10 nm.

It is also possible to provide an oxide layer of a material different from that of the gate insulating layer 14 between the oxide semiconductor layer 10 and the gate insulating layer 14.

The source electrode 16 is provided on the oxide semiconductor layer 10. The oxide semiconductor layer 10 is between the gate electrode 12 and the source electrode 16.

The source electrode 16 is provided above the first region 10a. The source electrode 16 is electrically connected to the first region 10a.

The source electrode 16 is made of, for example, a metal or a metal compound. The source electrode 16 is made of, for example, a metal having a chemical composition different from that of the barrier layer 20.

The source electrode 16 is made of, for example, titanium, titanium nitride, tungsten, tungsten nitride, copper, aluminum, tantalum, tantalum nitride, or molybdenum.

The drain electrode 18 is provided on the oxide semiconductor layer 10. The oxide semiconductor layer 10 is between the gate electrode 12 and the drain electrode 18.

The drain electrode 18 is provided above the second region 10b. The drain electrode 18 is electrically connected to the second region 10b.

The drain electrode 18 is made of, for example, titanium, titanium nitride, tungsten, tungsten nitride, copper, aluminum, tantalum, tantalum nitride, or molybdenum.

The barrier layer 20 is provided between the oxide semiconductor layer 10 and the source electrode 16. The barrier layer 20 is provided between the first region 10a and the source electrode 16. The barrier layer 20 is in contact with, for example, the source electrode 16. The barrier layer 20 functions as a diffusion barrier for oxygen that might diffuse from the oxide semiconductor layer 10 to the source electrode 16 side.

The barrier layer 20 is also provided between the oxide semiconductor layer 10 and the drain electrode 18. The barrier layer 20 is provided between the second region 10b and the drain electrode 18. The barrier layer 20 is in contact with, for example, the drain electrode 18. The barrier layer 20 functions as a diffusion barrier against oxygen that might diffuse from the oxide semiconductor layer 10 to the drain electrode 18 side.

The barrier layer 20 includes aluminum (Al), nitrogen (N), and at least one metal element selected from the group consisting of titanium (Ti), vanadium (V), zirconium (Zr), niobium (Nb), and chromium (Cr)). Among the atomic concentrations of elements other than aluminum (Al) and nitrogen (N) included in the barrier layer 20, the atomic concentration of the at least one metal element is the highest. Hereinafter, the at least one metal element described above will be simply described as a metal element.

The barrier layer 20 can be made of a nitride of the metal element and aluminum (Al).

The ratio of the atomic concentration of aluminum to the sum of the atomic concentration of the metal element and the atomic concentration of aluminum in the barrier layer 20 is, for example, in a range of 10% to 50%.

The thickness of the barrier layer 20 is less than the thickness of the contact layer 22 in the direction from the oxide semiconductor layer 10 to the source electrode 16, for example.

The thickness of the barrier layer 20 is, for example, one-half or less of the thickness of the contact layer 22. The thickness of the barrier layer 20 is, for example, in a range of 1 nm to 10 nm.

Hereinafter, a case where the barrier layer 20 is made of titanium nitride containing aluminum (Al) (that, is the "metal element" in the barrier layer 20 is titanium (Ti)) will be described as an example.

Figure 2:
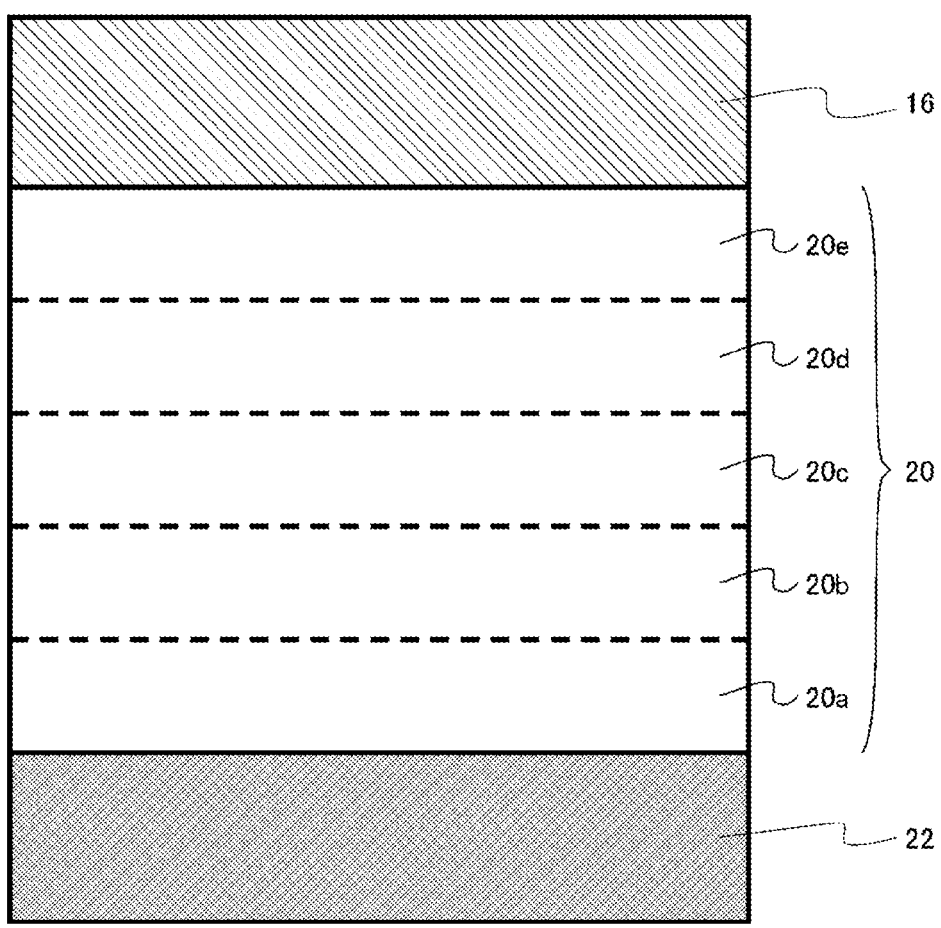
FIG. 2 is an enlarged schematic cross-sectional view of a semiconductor device of a first embodiment.

FIG. 2 is an enlarged schematic cross-sectional view of a part of the semiconductor device including the barrier layer 20.

The barrier layer 20 includes a first titanium high concentration portion 20a, a first aluminum high concentration portion 20b, a second titanium high concentration portion 20c, a second aluminum high concentration portion 20d, and a third titanium high concentration portion 20e.

The atomic concentration of titanium in the first titanium high concentration portion 20a is higher than the atomic concentration of aluminum therein. The atomic concentration of titanium in the second titanium high concentration portion 20c is higher than the atomic concentration of aluminum therein. The atomic concentration of titanium in the third titanium high concentration portion 20e is higher than the atomic concentration of aluminum therein.

The first titanium high concentration portion 20a, the second titanium high concentration portion 20c, and the third titanium high concentration portion 20e may or may not contain aluminum.

The atomic concentration of aluminum in the first aluminum high concentration portion 20b is higher than the atomic concentration of titanium therein. The atomic concentration of aluminum in the second aluminum high concentration portion 20d is higher than the atomic concentration of titanium therein.

The first aluminum high concentration portion 20b and the second aluminum high concentration portion 20d may or may not contain titanium.

The first titanium high concentration portion 20a is located between the first aluminum high concentration portion 20b and the oxide semiconductor layer 10. The first titanium high concentration portion 20a is located between the first aluminum high concentration portion 20b and the contact layer 22.

The first aluminum high concentration portion 20b is located between the first titanium high concentration portion 20a and the second titanium high concentration portion 20c. The second titanium high concentration portion 20c is located between the first aluminum high concentration portion 20b and the second aluminum high concentration portion 20d. The second aluminum high concentration portion 20d is located between the second titanium high concentration portion 20c and the third titanium high concentration portion 20e.

The first titanium high concentration portion 20a is in contact with, for example, the contact layer 22. The third titanium high concentration portion 20e is in contact with, for example, the source electrode 16.

The thickness in the direction from the contact layer 22 toward the source electrode 16 of the first titanium high concentration portion 20a, the first aluminum high concentration portion 20b, the second titanium high concentration portion 20c, the second aluminum high concentration portion 20d, and the third titanium high concentration portion 20e is each, for example, 0.2 nm to 0.5 nm.

As shown in FIG. 2, the barrier layer 20 has a structure in which a plurality of titanium high concentration portions and aluminum high concentration portions are alternately stacked. FIG. 2 illustrated the case where the number of titanium high concentration portions is 3 and the number of aluminum high concentration portions is 2, but the number of titanium high concentration portions and the number of aluminum high concentration portions are not particularly limited as long as each number is one or more.

The barrier layer 20 is formed by, for example, the ALD method. The barrier layer 20 is formed, for example, by alternately repeating a first treatment for supplying a material gas of titanium (Ti) and an ammonia gas (NH$_3$), and a second treatment for supplying a material gas of aluminum (Al) and an ammonia gas (NH$_3$) by an ALD method. By repeating the first treatment and the second treatment, titanium high concentration portions and aluminum high concentration portions are alternately formed.

The contact layer 22 is provided between the oxide semiconductor layer 10 and the barrier layer 20. More specifically, the contact layer 22 is provided between the first region 10a and the source electrode 16. Further, the contact layer 22 is provided between the second region 10b and the drain electrode 18.

The contact layer 22 is in contact with, for example, the barrier layer 20. The contact layer 22 is in contact with, for example, the oxide semiconductor layer 10. The contact layer 22 is in contact with, for example, the first region 10a. The contact layer 22 is in contact with, for example, the second region 10b.

The contact layer 22 has the function of reducing the electrical resistance between the first region 10a and the source electrode 16. The contact layer 22 has the function of reducing the electrical resistance between the second region 10b and the drain electrode 18.

The contact layer 22 includes oxygen (O) and at least one element selected from the group consisting of indium (In), zinc (Zn), tin (Sn), and cadmium (Cd). That is, the contact layer 22 is made of a metal oxide.

The contact layer 22 includes, for example, indium (In) and tin (Sn). The contact layer 22 is made of, for example, an oxide containing indium (In) and tin (Sn).

The thickness of the contact layer 22 is, for example, greater than the thickness of the barrier layer 20 in the direction from the oxide semiconductor layer 10 to the source electrode 16.

The thickness of the contact layer 22 is, for example, twice or more the thickness of the barrier layer 20. The thickness of the contact layer 22 is, for example, in a range of 5 nm to 30 nm.

The contact layer 22 is formed by, for example, a sputtering method or an ALD method.

The first insulating layer 24 is provided below the oxide semiconductor layer 10. The first insulating layer 24 is made of, for example, an oxide, a nitride, or an oxynitride. The first insulating layer 24 is made of, for example, silicon oxide, silicon nitride, or silicon oxynitride.

The second insulating layer 26 is provided on the oxide semiconductor layer 10. The second insulating layer 26 is provided between the source electrode 16 and the drain electrode 18.

The second insulating layer 26 electrically separates the source electrode 16 from the drain electrode 18. The second insulating layer 26 is made of, for example, an oxide, a nitride, or an oxynitride. The second insulating layer 26 is made of, for example, silicon oxide, silicon nitride, or silicon oxynitride.

Hereinafter, the operation and effect of the semiconductor device of the first embodiment will be described.

For example, when an oxide semiconductor transistor is used as a switching transistor of a memory cell, the oxide semiconductor transistor undergoes heat treatment associated with the formation of the memory cell and wiring. The threshold voltage of the oxide semiconductor transistor may fluctuate due to the heat treatment.

The fluctuation of the threshold voltage of the oxide semiconductor transistor is caused by the oxygen in the oxide semiconductor layer on which the channel is formed escapes to the side of the source electrode and the drain electrode. Oxygen deficiency occurs in the oxide semiconductor layer due to the escape of the oxygen in the oxide semiconductor layer.

Oxygen deficiency functions as a donor in the oxide semiconductor layer. Therefore, for example, when the oxide semiconductor transistor is an n-channel transistor, the threshold voltage of the oxide semiconductor transistor decreases when oxygen deficiency occurs.

The transistor 100 of the first embodiment includes a barrier layer 20 that prevents the diffusion of the oxygen between the oxide semiconductor layer 10 and the source electrode 16 and between the oxide semiconductor layer 10 and the drain electrode 18. By providing the barrier layer 20, the oxygen in the oxide semiconductor layer 10 is prevented from escaping to the side of the source electrode 16 and the drain electrode 18. Therefore, the fluctuation of the threshold voltage of the transistor 100 is reduced.

Figure 3:
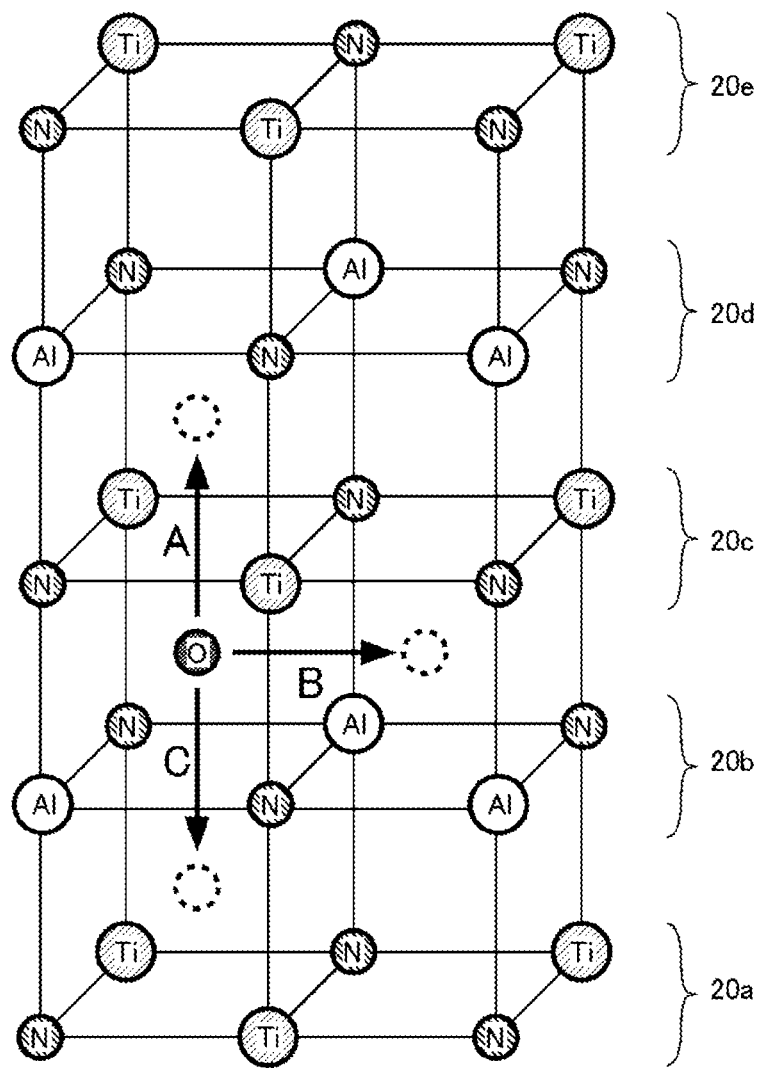
FIG. 3 depicts an operation and effect of a semiconductor device of a first embodiment.

FIG. 3 depicts the operation and effect of the semiconductor device of the first embodiment. FIG. 3 shows the crystal structure of aluminum-containing titanium nitride forming the barrier layer 20.

The crystal structure of titanium nitride is a sodium chloride type crystal structure. The crystal structure of aluminum-containing titanium nitride is also a sodium chloride type crystal structure.

Among the aluminum-containing titanium nitrides that form the barrier layer 20, for example, as shown in FIG. 3, an atomic layer including titanium atoms and nitrogen atoms and an atomic layer including aluminum atoms and nitrogen atoms are stacked alternately. The atomic layer including titanium atoms and nitrogen atoms corresponds to, for example, the first titanium high concentration portion 20a, the second titanium high concentration portion 20c, and the third titanium high concentration portion 20e. Further, the atomic layer including aluminum atoms and nitrogen atoms corresponds to, for example, the first aluminum high concentration portion 20b and the second aluminum high concentration portion 20d.

Oxygen atoms contained in aluminum-containing titanium nitride are stable at interstitial positions. The center of gravity of a regular tetrahedron including two titanium atoms, two aluminum atoms, and four nitrogen atoms is the stable position of the oxygen atom.

There are three types of transition states for the oxygen atom to move to an adjacent stable position. The three types of transition states are a first transition state surrounded by two titanium atoms and two nitrogen atoms, a second transition state surrounded by one titanium atom, one aluminum atom, and two nitrogen atoms, and a third transition state surrounded by two aluminum atoms and two nitrogen atoms.

There are three paths corresponding to the three types of transition states in order for the oxygen atom to move to an adjacent stable position. The three types of paths are path A, path B, and path C shown in FIG. 3. Paths A, B, and C correspond to the first, second, and third transition states.

Simulations performed by the inventor revealed that the diffusion barrier of the path A is 4.8 eV, the diffusion barrier of the path B is 1.5 eV, and the diffusion barrier of the path C is 1.4 eV. In the case of aluminum-free titanium nitride, the diffusion barrier of the path through which oxygen atoms move to adjacent stable positions is 0.9 eV.

Titanium oxide contains aluminum, which increases the diffusion barrier of the path through which oxygen atoms move to adjacent stable positions. Therefore, titanium oxide can prevent the diffusion of oxygen by containing aluminum. In particular, the diffusion of oxygen can be effectively prevented by providing the first transition state surrounded by two titanium atoms and two nitrogen atoms.

It is considered that the reason why the inclusion of aluminum in titanium oxide makes the diffusion barrier of oxygen atoms higher is due to the fact that the lattice constant of the crystal becomes smaller by including aluminum.

In the barrier layer 20 of the transistor 100 of the first embodiment, titanium high concentration portions and aluminum high concentration portions are alternately stacked from the contact layer 22 toward the source electrode 16 or the drain electrode 18. By providing the titanium high concentration portion with the first transition state having a high diffusion barrier, the diffusion of oxygen from the contact layer 22 toward the source electrode 16 or the drain electrode 18 is prevented. Therefore, oxygen in the oxide semiconductor layer 10 is prevented from escaping to the side of the source electrode 16 and the drain electrode 18. Therefore, the fluctuation of the threshold voltage of the transistor 100 is reduced.

Although FIG. 3 illustrates a case where each of the titanium high concentration portion and the aluminum high concentration portion includes a single atom layer, the titanium high concentration portion and the aluminum high concentration portion are not necessarily limited to a single atom layer. For example, each of the titanium high concentration portion and the aluminum high concentration portion may include a multi-atom layer. Further, aluminum atoms may be contained in the titanium high concentration portion. Further, titanium atoms may be contained in the aluminum high concentration portion.

The ratio of the atomic concentration of aluminum to the sum of the atomic concentration of the metal element and the atomic concentration of aluminum in the barrier layer 20 is preferably 10% or more and 50% or less, and more preferably 20% or more and 40% or less. By exceeding the above-described lower limit value, the barrier layer 20 can be provided with a certain amount of the first to third transition states, and the effect of preventing the diffusion of oxygen is improved. Further, when the value falls below the above-described upper limit value, the barrier layer 20 can be provided with a certain amount of the first transition state and the effect of preventing the diffusion of oxygen is improved. Further, by falling below the above-described upper limit value, the resistance of the barrier layer 20 can be reduced and the electrical resistance between the source electrode 16 and the oxide semiconductor layer 10 can be reduced. Further, the electrical resistance between the drain electrode 18 and the oxide semiconductor layer 10 can be reduced.

The thickness of the barrier layer 20 is preferably 1 nm to 10 nm, more preferably 2 nm to 8 nm, and further preferably 5 nm or less. By exceeding the above-described lower limit value, the effect of preventing the diffusion of oxygen is improved. By falling below the above-described upper limit value, the electrical resistance caused by the barrier layer 20 can be reduced and the electrical resistance between the source electrode 16 and the oxide semiconductor layer 10 can thus be reduced. Likewise, the electrical resistance between the drain electrode 18 and the oxide semiconductor layer 10 can be reduced.

The first titanium high concentration portion 20a is preferably in contact with the contact layer 22. By providing the first transition state having a high diffusion barrier at the position closest to the contact layer 22, the invasion of oxygen from the contact layer 22 to the barrier layer 20 is prevented.

For example, when the first aluminum high concentration portion 20b is in contact with the contact layer 22, there is a concern that the first aluminum high concentration portion 20b is oxidized to form aluminum oxide having high electrical resistance. When the first titanium high concentration portion 20a is in contact with the contact layer 22, the formation of aluminum oxide can be prevented.

The transistor 100 of the first embodiment includes the contact layer 22 between the oxide semiconductor layer 10 and the barrier layer 20. By providing the contact layer 22, for example, the contact resistance is reduced as compared with the case where the barrier layer 20 is in direct contact with the oxide semiconductor layer 10 without providing the contact layer 22.

The contact layer 22 of the transistor 100 is an oxide including oxygen (O) and at least one element selected from the group consisting of indium (In), zinc (Zn), tin (Sn), and cadmium (Cd). The contact layer 22 helps prevent the formation of a reaction product in the heat treatment having high electrical resistance between the oxide semiconductor layer 10 and the contact layer 22. Therefore, the contact resistance between the oxide semiconductor layer 10 and the contact layer 22 can be reduced.

From the viewpoint of reducing the contact resistance between the oxide semiconductor layer 10 and the contact layer 22, the contact layer 22 is preferably made of an oxide including indium (In) and tin (Sn).

The thickness of the barrier layer 20 is preferably less than the thickness of the contact layer 22. The thickness of the barrier layer 20 is preferably one-half or less, more preferably one-third or less, of the thickness of the contact layer 22.

The contact layer 22 is preferably thicker than the barrier layer 20. The thickness of the contact layer 22 is preferably two or more times, more preferably three times or more, the thickness of the barrier layer 20.

The electrical resistivity of the barrier layer 20 is higher than, for example, the electrical resistivity of the contact layer 22. By making the thickness of the barrier layer 20 less than the thickness of the contact layer 22, in other words, by making the thickness of the contact layer 22 greater than the thickness of the barrier layer 20, the electrical resistance between the source electrode 16 and the oxide semiconductor layer 10 can be reduced. Furthermore, the electrical resistance between the drain electrode 18 and the oxide semiconductor layer 10 can be reduced.

In the above examples, titanium (Ti) is used as a metal element. However, vanadium (V), zirconium (Zr), niobium (Nb), or chromium (Cr) may be used instead of titanium (Ti) as the metal element, and similar effects can be achieved. Nitrides of each of Vanadium (V), zirconium (Zr), niobium (Nb), and chromium (Cr) have a sodium chloride type crystal structure, similar to titanium.

As described above, according to the first embodiment, an oxide semiconductor transistor in which the fluctuation of the threshold voltage after the heat treatment is reduced and having high heat resistance is provided.

Second Embodiment

A semiconductor device of a second embodiment is different from the semiconductor device of the first embodiment in that the gate electrode 12 surrounds the oxide semiconductor layer 10.

Figure 4:
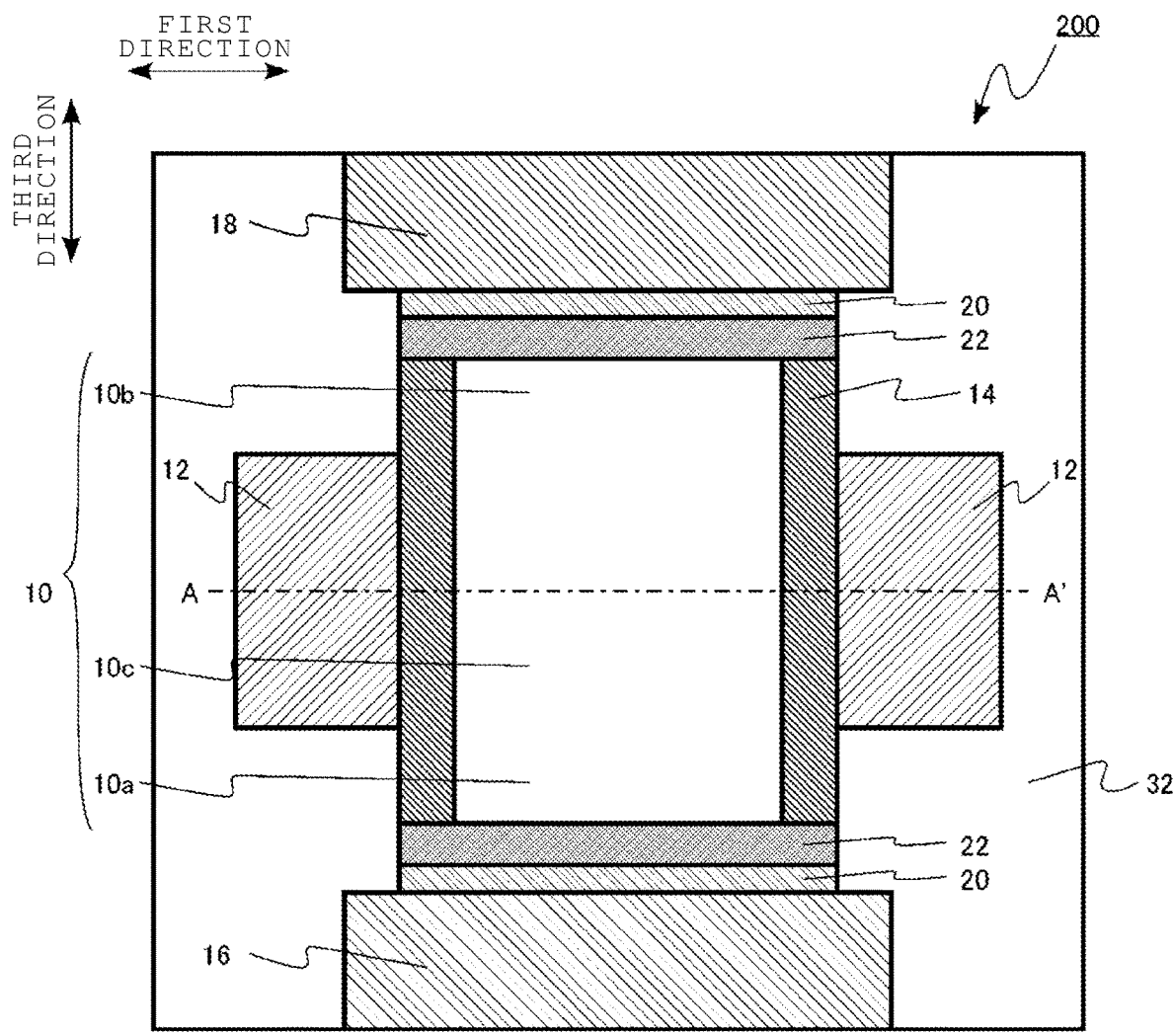
FIG. 4 is a schematic cross-sectional view of a semiconductor device of a second embodiment.
Figure 5:
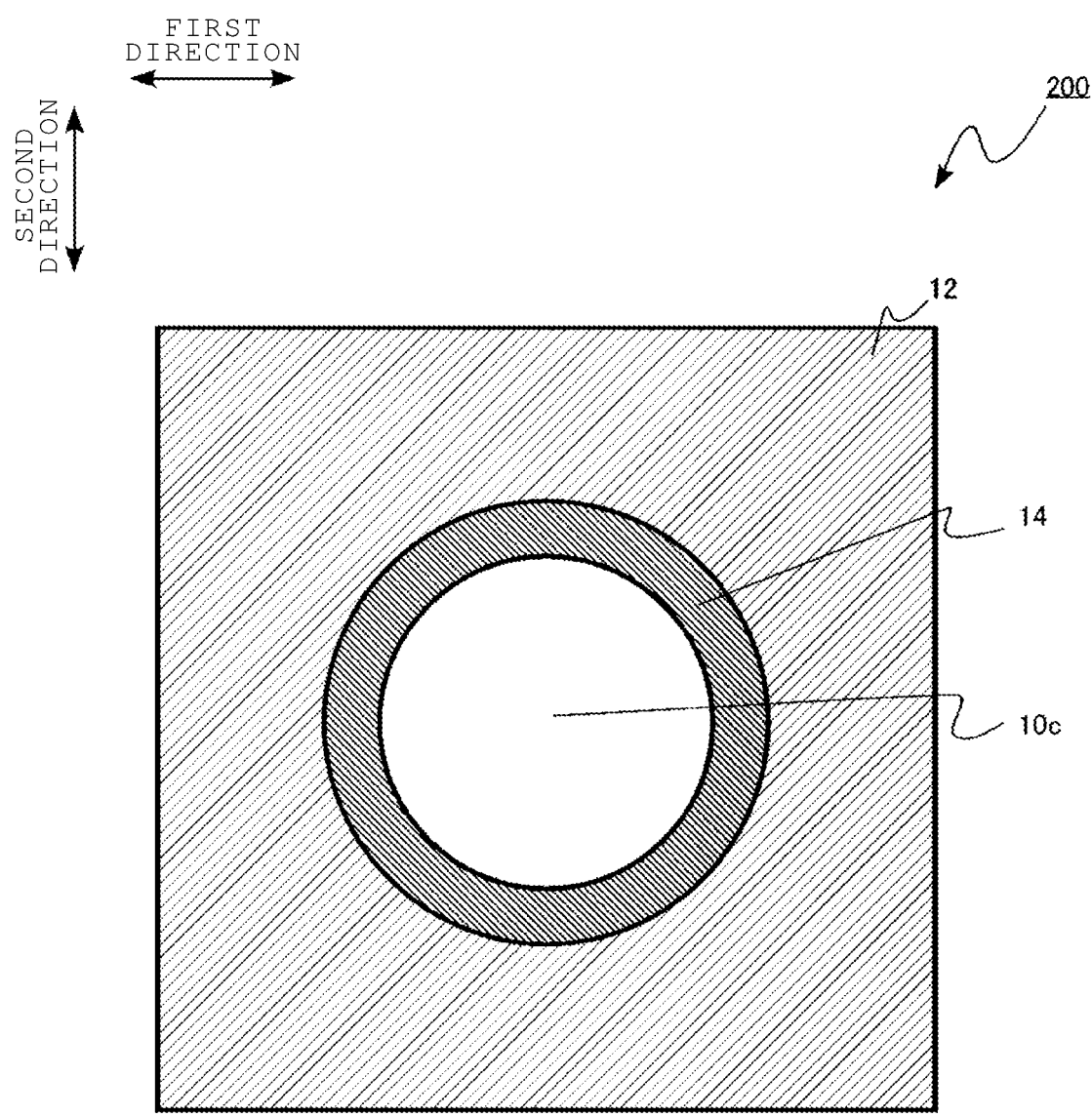
FIG. 5 is a schematic cross-sectional view of a semiconductor device of a second embodiment.

FIGS. 4 and 5 are schematic cross-sectional views of the semiconductor device of the second embodiment. FIG. 5 is a cross-sectional view taken along the line AA' of FIG. 4. In FIG. 4, the horizontal direction is referred to as a first direction, the depth direction is referred to as a second direction, and the vertical direction is referred to as a third direction.

The semiconductor device of the second embodiment is a transistor 200. The transistor 200 is an oxide semiconductor transistor in which a channel is formed. The transistor 200 is a so-called Surrounding Gate Transistor (SGT) in which a gate electrode surrounds an oxide semiconductor layer on which a channel is formed. The transistor 200 is a so-called vertical transistor.

The transistor 200 includes the oxide semiconductor layer 10, the gate electrode 12, a gate insulating layer 14, a source electrode 16, a drain electrode 18, a barrier layer 20, a contact layer 22, and an interlayer insulating layer 32.

The oxide semiconductor layer 10 is provided between the source electrode 16 and the drain electrode 18. A channel serving as a current path when the transistor 200 is turned on is formed in the oxide semiconductor layer 10. The oxide semiconductor layer 10 extends along the third direction. The oxide semiconductor layer 10 has a columnar shape extending along the third direction. The oxide semiconductor layer 10 is, for example, cylindrical.

The direction in which electrons flow in the channel is called the channel length direction. The third direction is the channel length direction of the transistor 200.

The oxide semiconductor layer 10 is made of an oxide semiconductor. The oxide semiconductor layer 10 is made of a metal oxide. The oxide semiconductor layer 10 has, for example, an amorphous structure.

The oxide semiconductor layer 10 includes, for example, indium (In), zinc (Zn), and at least one of gallium (Ga) and aluminum (Al). The ratio of the total atomic concentration of indium, gallium, aluminum, and zinc to the total atomic concentration of the metal elements contained in the oxide semiconductor layer 10 is, for example, 90% or more. The ratio of the total atomic concentration of indium, gallium, aluminum, and zinc to the total atomic concentration of elements other than oxygen contained in the oxide semiconductor layer 10 is, for example, 90% or more. For example, in the oxide semiconductor layer 10, there is no element other than oxygen having an atomic concentration higher than any one of indium, gallium, aluminum, and zinc.

The oxide semiconductor layer 10 includes a first region 10a, a second region 10b, and a third region 10c. The third region 10c is a region between the first region 10a and the second region 10b.

The oxide semiconductor layer 10 contains, for example, oxygen deficiency. The oxygen deficiency in the oxide semiconductor layer 10 functions as a donor.

The width of the oxide semiconductor layer 10 in the first direction is, for example, 20 nm to 100 nm. The length of the oxide semiconductor layer 10 in the third direction is, for example, 80 nm to 200 nm.

The gate electrode 12 is provided o surround the oxide semiconductor layer 10. The gate electrode 12 is provided around the oxide semiconductor layer 10.

The gate electrode 12 is, for example, a metal, a metal compound, or a semiconductor. The gate electrode 12 is, for example, titanium nitride (TiN) or tungsten (W). The gate length of the gate electrode 12 is, for example, 20 nm to 100 nm. The gate length of the gate electrode 12 is the length of the gate electrode 12 in the third direction.

The gate insulating layer 14 is provided between the oxide semiconductor layer 10 and the gate electrode 12. The gate insulating layer 14 surrounds the oxide semiconductor layer 10. The gate insulating layer 14 is provided between the third region 10c and the gate electrode 12.

The gate insulating layer 14 is made of, for example, an oxide or an oxynitride. The gate insulating layer 14 is made of, for example, silicon oxide or aluminum oxide. The thickness of the gate insulating layer 14 is, for example, 2 nm to 10 nm.

It is also possible to provide an oxide layer (not shown) of a material different from that of the gate insulating layer 14 between the oxide semiconductor layer 10 and the gate insulating layer 14.

The source electrode 16 is provided below the oxide semiconductor layer 10. The source electrode 16 is provided below the first region 10a. The source electrode 16 is electrically connected to the first region 10a.

The source electrode 16 is made of, for example, a metal or a metal compound. The source electrode 16 is made of, for example, a metal having a chemical composition different from that of the barrier layer 20.

The source electrode 16 is made of, for example, titanium, titanium nitride, tungsten, tungsten nitride, copper, aluminum, tantalum, tantalum nitride, or molybdenum.

The drain electrode 18 is provided on the oxide semiconductor layer 10. The drain electrode 18 is provided above the second region 10b. The drain electrode 18 is electrically connected to the second region 10b.

The drain electrode 18 is made of, for example, titanium, titanium nitride, tungsten, tungsten nitride, copper, aluminum, tantalum, tantalum nitride, or molybdenum.

The barrier layer 20 is provided between the oxide semiconductor layer 10 and the source electrode 16. The barrier layer 20 is provided between the first region 10a and the source electrode 16. The barrier layer 20 is in contact with, for example, the source electrode 16. The barrier layer 20 functions as a diffusion barrier for oxygen diffused from the oxide semiconductor layer 10 to the source electrode 16 side.

The barrier layer 20 is also provided between the oxide semiconductor layer 10 and the drain electrode 18. The barrier layer 20 is provided between the second region 10b and the drain electrode 18. The barrier layer 20 is in contact with, for example, the drain electrode 18. The barrier layer 20 functions as a diffusion barrier for oxygen diffused from the oxide semiconductor layer 10 to the drain electrode 18 side.

The barrier layer 20 includes aluminum (Al), nitrogen (N), and at least one metal element selected from the group consisting of titanium (Ti), vanadium (V), zirconium (Zr), niobium (Nb), and chromium (Cr). Among the atomic concentrations of elements other than aluminum (Al) and nitrogen (N) included in the barrier layer 20, the atomic concentration of the at least one metal element is the highest. Hereinafter, the at least one metal element described above will be simply described as a metal element.

The barrier layer 20 is made of a nitride of the at least one metal element containing aluminum (Al).

The ratio of the atomic concentration of aluminum to the sum of the atomic concentration of the metal element and the atomic concentration of aluminum in the barrier layer 20 is, for example, 10% or more and 50% or less.

The thickness of the barrier layer 20 is less than the thickness of the contact layer 22 in the direction from the oxide semiconductor layer 10 to the source electrode 16, for example.

The thickness of the barrier layer 20 is, for example, one-half or less of the thickness of the contact layer 22. The thickness of the barrier layer 20 is, for example, 1 nm to 10 nm.

The barrier layer 20 includes a first titanium high concentration portion 20a, a first aluminum high concentration portion 20b, a second titanium high concentration portion 20c, a second aluminum high concentration portion 20d, and a third titanium high concentration portion 20e.

The contact layer 22 is provided between the oxide semiconductor layer 10 and the barrier layer 20. More specifically, the contact layer 22 is provided between the first region 10a and the source electrode 16. Further, the contact layer 22 is provided between the second region 10b and the drain electrode 18.

The contact layer 22 is in contact with the barrier layer 20, for example. The contact layer 22 is in contact with, for example, the oxide semiconductor layer 10. The contact layer 22 is in contact with, for example, the first region 10a. The contact layer 22 is in contact with, for example, the second region 10b.

The contact layer 22 has the function of reducing the resistance between the first region 10a and the source electrode 16. The contact layer 22 has the function of reducing the resistance between the second region 10b and the drain electrode 18.

The contact layer 22 includes oxygen (O) and at least one element selected from the group consisting of indium (In), zinc (Zn), tin (Sn), and cadmium (Cd). That is, the contact layer 22 is made of an oxide.

The contact layer 22 includes, for example, indium (In) and tin (Sn). The contact layer 22 is made of, for example, an oxide containing indium (In) and tin (Sn).

The contact layer 22 is, for example, thicker than the barrier layer 20 in the direction from the oxide semiconductor layer 10 to the source electrode 16.

The thickness of the contact layer 22 is, for example, at least twice the thickness of the barrier layer 20. The thickness of the contact layer 22 is, for example, 5 nm to 30 nm.

The interlayer insulating layer 32 is provided around the gate electrode 12, the source electrode 16, and the drain electrode 18. The interlayer insulating layer 32 is made of, for example, an oxide, a nitride, or an oxynitride. The interlayer insulating layer 32 is made of, for example, silicon oxide, silicon nitride, or silicon oxynitride.

As described above, according to the second embodiment, as in the first embodiment, an oxide semiconductor transistor in which the fluctuation of the threshold voltage after the heat treatment is reduced and having high heat resistance is provided. Further, according to the second embodiment, the SGT makes it possible to provide the transistors at a high density per unit area.

Third Embodiment

A semiconductor storage device of a third embodiment is described with reference to FIGS. 6-10.

The semiconductor storage device of the third embodiment is a semiconductor memory 300 such as a Dynamic Random Access Memory (DRAM). The semiconductor memory 300 includes the transistor 200 of the second embodiment as a switching transistor for a memory cell of a DRAM.

Figure 6:
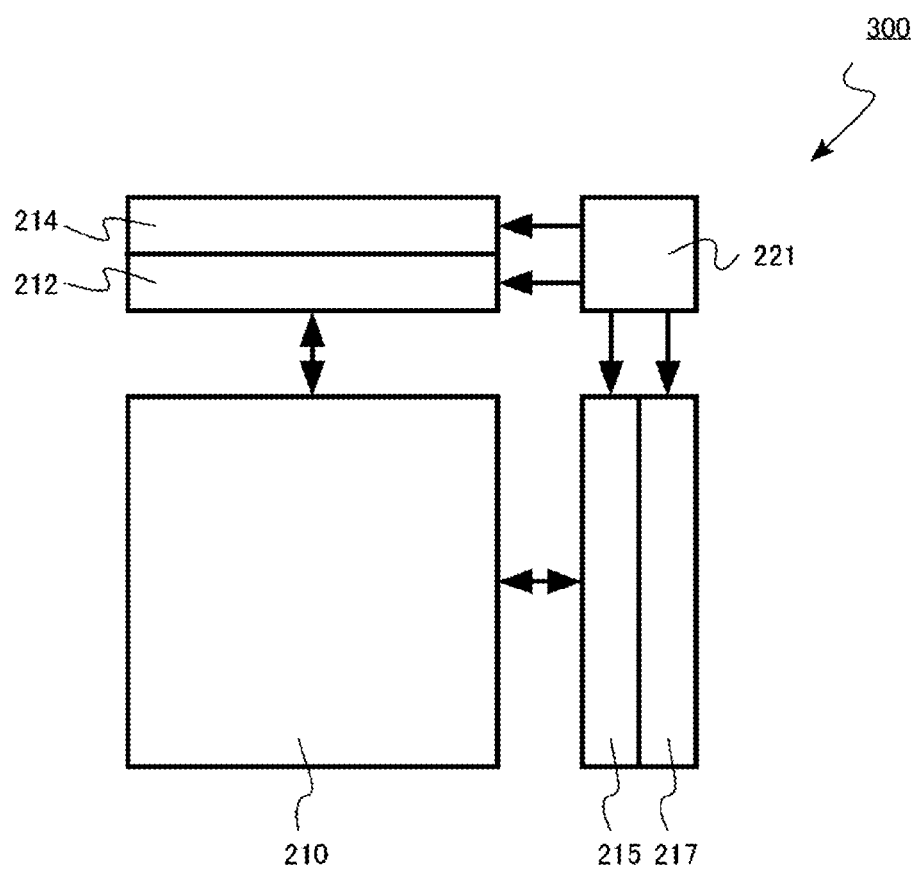
FIG. 6 is a block diagram of a semiconductor storage device according to a third embodiment.

FIG. 6 is a block diagram of the semiconductor storage device of the third embodiment.

As shown in FIG. 6, the semiconductor memory 300 includes a memory cell array 210, a word line driver circuit 212, a row decoder circuit 214, a sense amplifier circuit 215, a column decoder circuit 217, and a control circuit 221.

Figure 7:
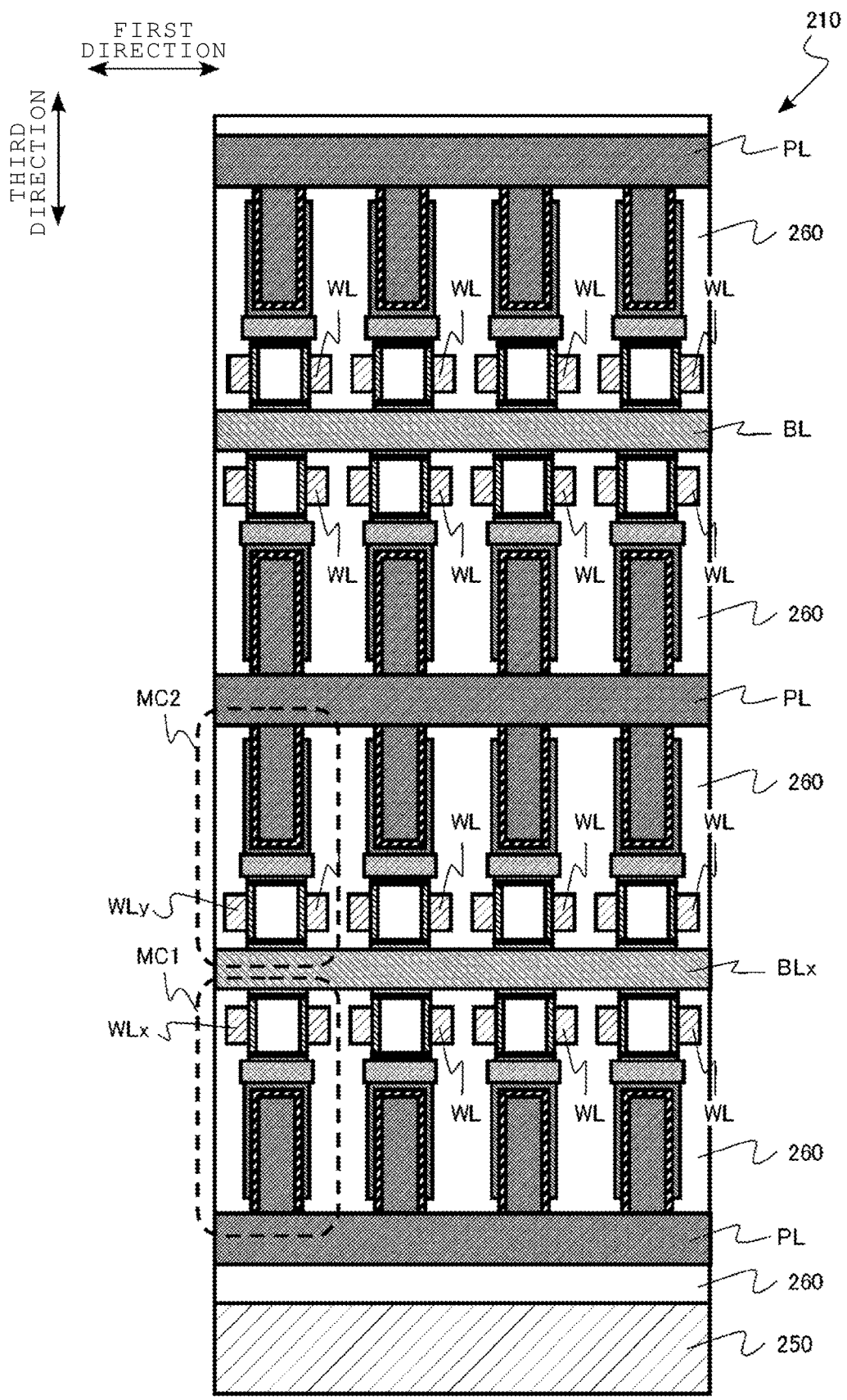
FIG. 7 is a schematic cross-sectional view of a memory cell array of a semiconductor storage device of a third embodiment.
Figure 8:
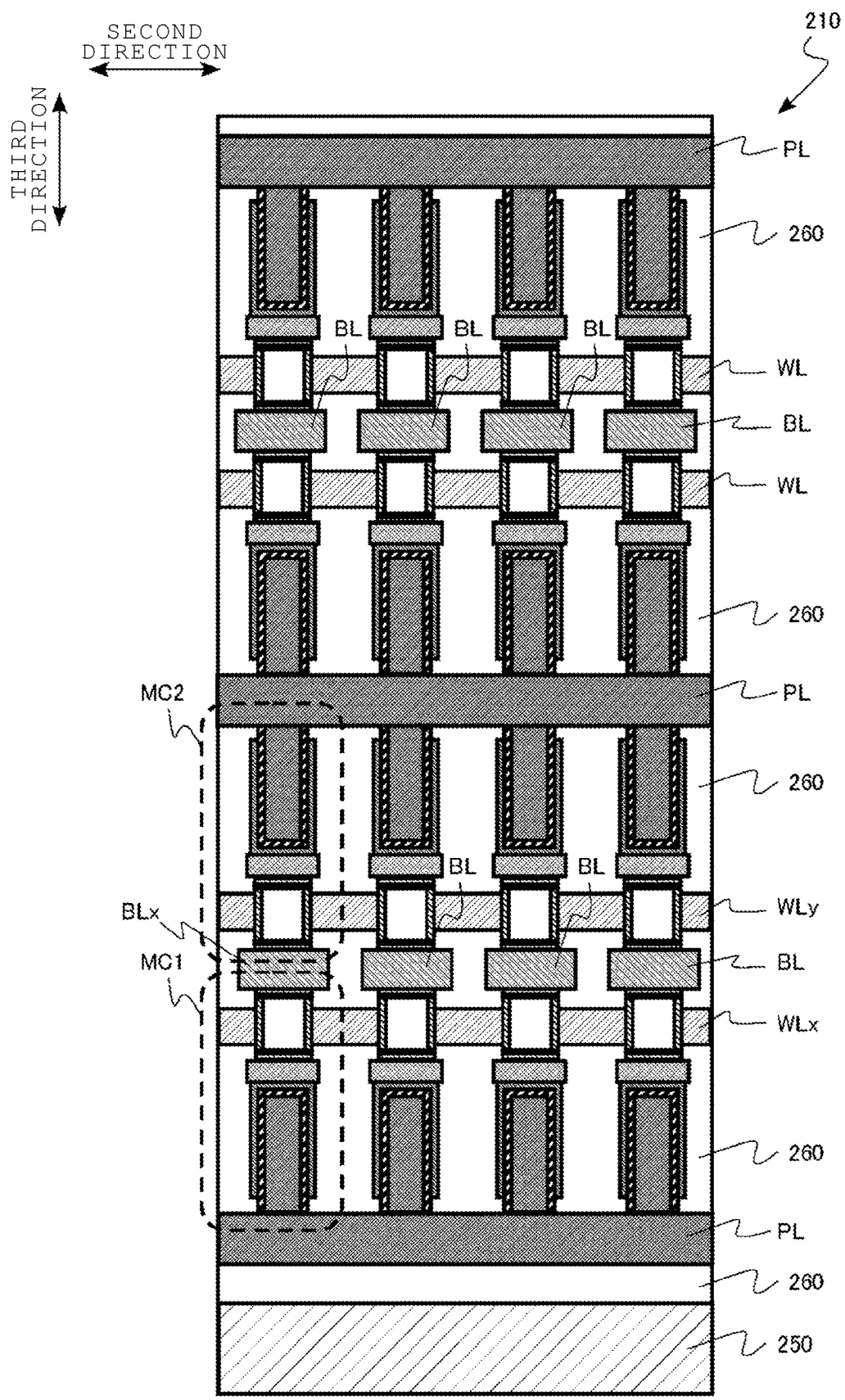
FIG. 8 is a schematic cross-sectional view of a memory cell array of a semiconductor storage device of a third embodiment.

FIGS. 7 and 8 are schematic cross-sectional views of a memory cell array of the semiconductor storage device of the third embodiment. FIG. 7 is a cross-sectional view of a plane parallel to the first direction and the third direction, and FIG. 8 is a cross-sectional view of a plane parallel to the second direction and the third direction. As described above, the first direction is perpendicular to the second direction, and the third direction is perpendicular to the first direction and the second direction. The third direction is, for example, a direction perpendicular to the substrate.

The memory cell array 210 of the third embodiment has a three-dimensional structure in which memory cells are three-dimensionally arranged. Areas surrounded by broken lines in FIGS. 7 and 8 each represent one memory cell (MC).

The memory cell array 210 includes a silicon substrate 250.

The memory cell array 210 includes, for example, a plurality of bit lines BL and a plurality of word lines WL on the silicon substrate 250. The bit line BL extends along the first direction. The word line WL extends along the second direction.

The bit lines BL and the word lines WL intersect vertically, for example. A memory cell is arranged in a region where a bit line BL and a word line WL intersect. For example, the memory cells include a first memory cell MC1 and a second memory cell MC2.

The bit line BL connected to the first memory cell MC1 and the second memory cell MC2 is referred to as a bit line BLx. The word line WL connected to the first memory cell MC1 is referred to as a word line WLx.

The word line WL connected to the second memory cell MC2 is referred to as a word line WLy. The word line WLx is provided on one side of the bit line BLx. The word line WLy is provided on the other side of the bit line BLx.

The memory cell array 210 includes a plurality of plate electrode wires PL. The plate electrode wire PL is connected to a plate electrode 72 of each memory cell.

The memory cell array 210 includes an interlayer insulating layer 260 for electrical separation of each wiring and each electrode.

The plurality of word lines WL are electrically connected to the row decoder circuit 214. The plurality of bit lines BL are electrically connected to the sense amplifier circuit 215.

The row decoder circuit 214 has a function of selecting a word line WL according to an input row address signal. The word line driver circuit 212 has a function of applying a predetermined voltage to the word line WL selected by the row decoder circuit 214.

The column decoder circuit 217 has a function of selecting a bit line BL according to an input column address signal. The sense amplifier circuit 215 has a function of applying a predetermined voltage to the bit line BL selected by the column decoder circuit 217. The sense amplifier circuit 215 also has a function of detecting and amplifying the potential of the bit line BL.

The control circuit 221 has a function of controlling the word line driver circuit 212, the row decoder circuit 214, the sense amplifier circuit 215, the column decoder circuit 217, and other circuits (not shown).

The word line driver circuit 212, the row decoder circuit 214, the sense amplifier circuit 215, the column decoder circuit 217, and the control circuit 221 include, for example, transistors and wiring layers (not shown). The transistor is formed using, for example, the silicon substrate 250.

The bit lines BL and the word lines WL are made of, for example, metal. The bit lines BL and the word lines WL are made of, for example, titanium nitride, tungsten, or a stacked structure of titanium nitride and tungsten.

Figure 9:
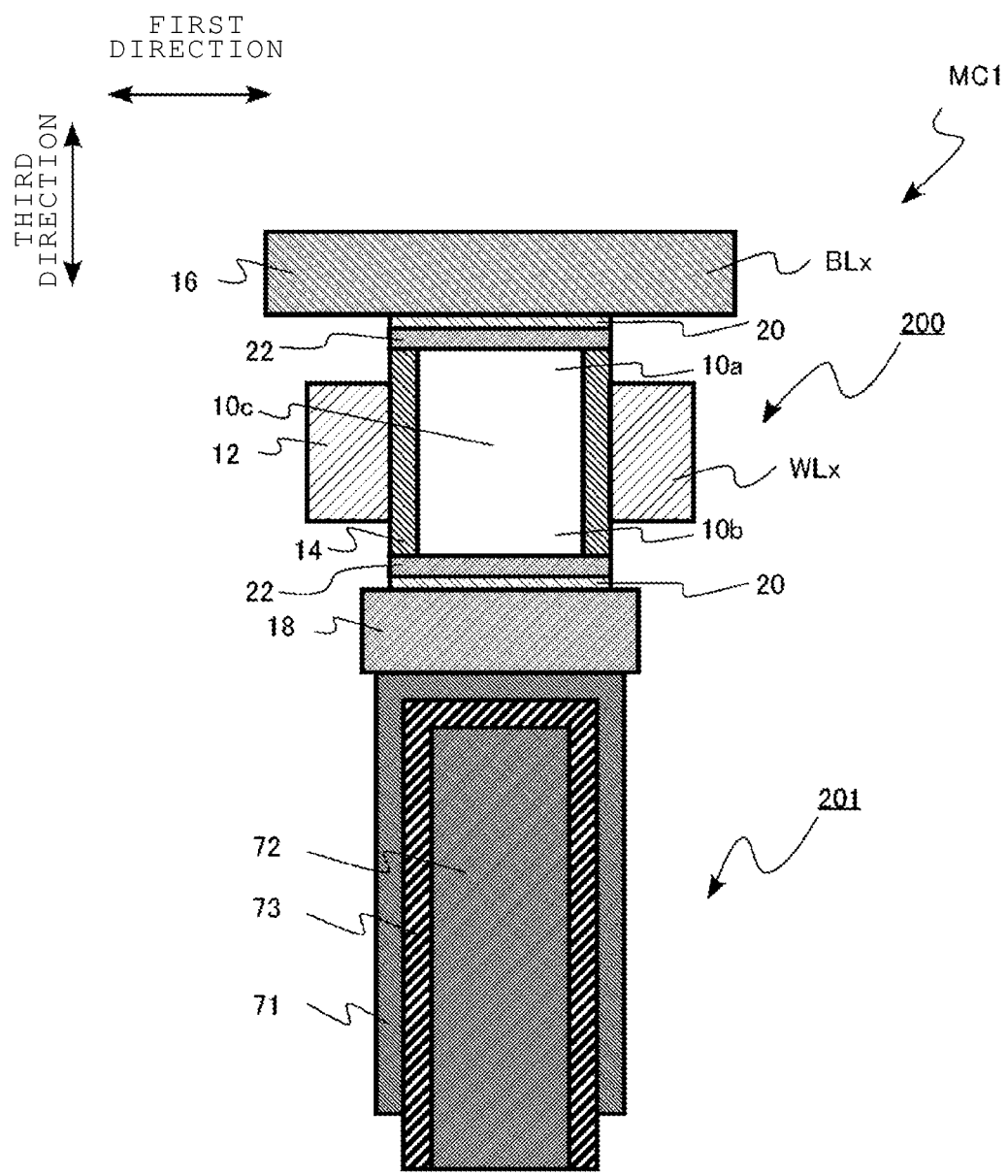
FIG. 9 is a schematic cross-sectional view of a first memory cell of a semiconductor storage device of a third embodiment.
Figure 10:
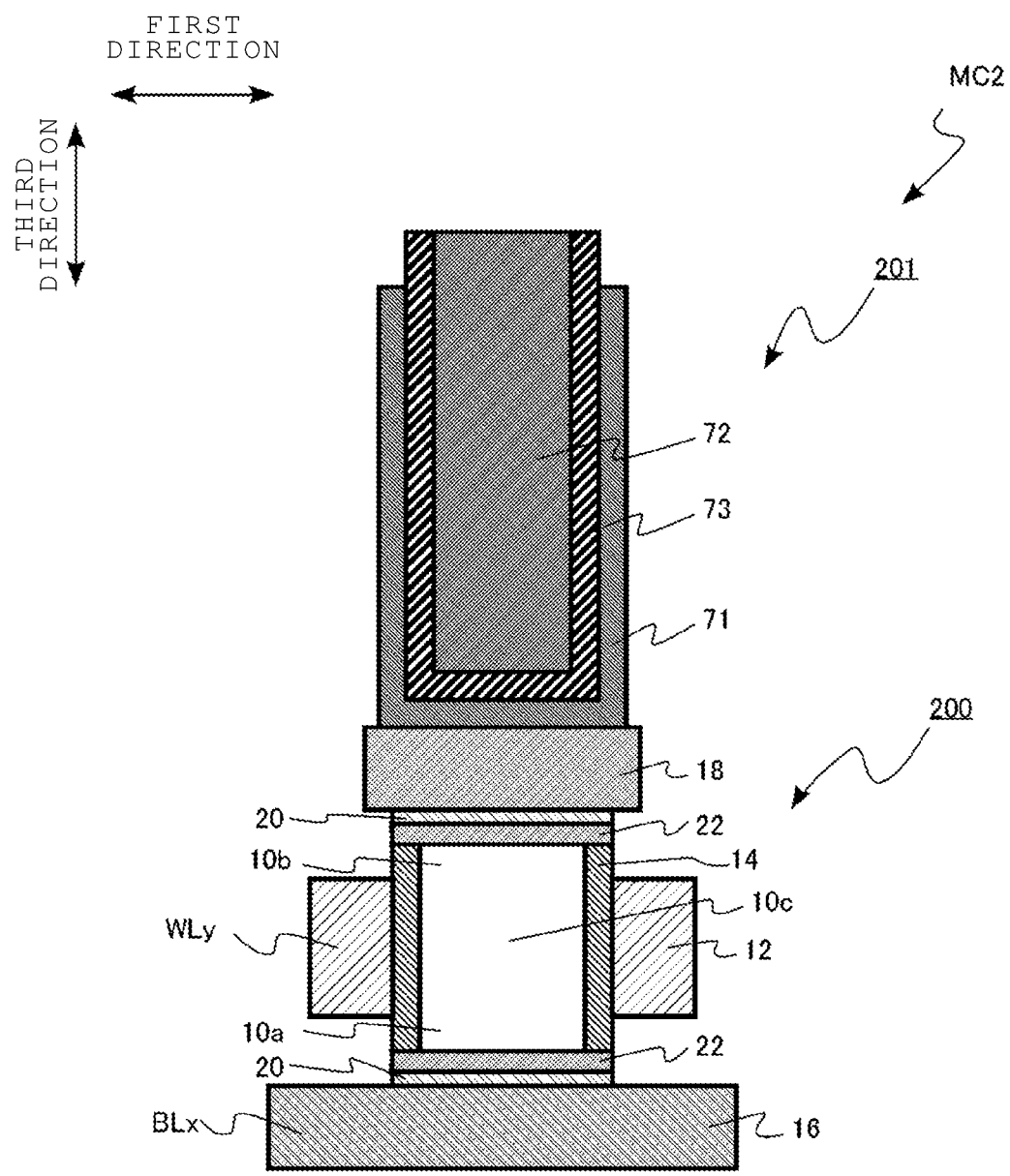
FIG. 10 is a schematic cross-sectional view of a second memory cell of a semiconductor storage device of a third embodiment.

FIG. 9 is a schematic cross-sectional view of the first memory cell MC1 of the semiconductor storage device of the third embodiment. FIG. 10 is a schematic cross-sectional view of the second memory cell MC2 of the semiconductor storage device of the third embodiment.

The first memory cell MC1 is provided between the silicon substrate 250 and the bit line BLx. The bit line BLx is provided between the silicon substrate 250 and the second memory cell MC2.

The first memory cell MC1 is provided below the bit line BLx. The second memory cell MC2 is provided above the bit line BLx.

The first memory cell MC1 is provided on one side of the bit line BLx. The second memory cell MC2 is provided on the other side of the bit line BLx.

The second memory cell MC2 has a structure in which the first memory cell MC1 is turned upside down. Each of the first memory cell MC1 and the second memory cell MC2 includes the transistor 200 and the capacitor 201.

The transistor 200 includes an oxide semiconductor layer 10, a gate electrode 12, a gate insulating layer 14, a source electrode 16, a drain electrode 18, a barrier layer 20, and a contact layer 22. The transistor 200 has the same configuration as the transistor 200 of the second embodiment.

The oxide semiconductor layer 10 includes a first region 10a, a second region 10b, and a third region 10c. The third region 10c is a region between the first region 10a and the second region 10b. The third region 10c is surrounded by the gate electrode 12. The gate electrode 12 is a part of the word line WL.

The barrier layer 20 includes a first titanium high concentration portion 20a, a first aluminum high concentration portion 20b, a second titanium high concentration portion 20c, a second aluminum high concentration portion 20d, and a third titanium high concentration portion 20e.

The capacitor 201 includes a cell electrode 71, the plate electrode 72, and a capacitor insulating film 73. The cell electrode 71 and the plate electrode 72 are made of, for example, titanium nitride. Further, the capacitor insulating film 73 has, for example, a stacked structure of zirconium oxide, aluminum oxide, and zirconium oxide.

The capacitor 201 is electrically connected to one end of the oxide semiconductor layer 10 of the first memory cell MC1 and the second memory cell MC2. The cell electrode 71 of the capacitor 201 is connected to the drain electrode 18. The plate electrode 72 is connected to the plate electrode line PL.

As shown in FIGS. 9 and 10, the source electrode 16 is connected to a bit line, i.e., BLx. The gate electrode 12 is connected to a word line, i.e., WLx r WLy.

In FIGS. 7, 8, 9, and 10, each bit line BL and source electrode 16, and each word line WL and gate electrode 12 are simultaneously formed of the same material, for example. Each bit line BL and source electrode 16, and each word line WL and gate electrode 12 may be separately formed of different materials.

The bit line BLx is electrically connected to another end opposite to the end to which the capacitor 201 of the oxide semiconductor layer 10 of the first memory cell MC1 is connected. The bit line BLx is electrically connected to another end opposite to the end to which the capacitor 201 of the oxide semiconductor layer 10 of the second memory cell MC2 is connected.

The word line WLx is electrically connected to the gate electrode 12 of the first memory cell MC1. Further, the word line WLy is electrically connected to the gate electrode 12 of the second memory cell MC2.

The transistor 200 includes the barrier layer 20 between the oxide semiconductor layer 10 and each of the source electrode 16 and the drain electrode 18. Further, the contact layer 22 is provided between the oxide semiconductor layer 10 and the barrier layer 20.

When an oxide semiconductor transistor is used as a switching transistor for a DRAM memory cell, a high temperature and long-time heat treatment is applied after the transistor is formed. The heat treatment is, for example, a heat treatment for forming a capacitor. The threshold voltage of the oxide semiconductor transistor tends to fluctuate due to high temperature and long-time heat treatment.

The transistor 200 includes the barrier layer 20 between the oxide semiconductor layer 10 and each of the source electrode 16 and the drain electrode 18. Therefore, even if a high temperature and long-time heat treatment is applied after the transistor is formed, the fluctuation of the threshold voltage is reduced.

Further, the transistor 200 includes the contact layer 22 between the oxide semiconductor layer 10 and the barrier layer 20. Therefore, the contact resistance is reduced. Therefore, the on-current of the transistor 200 increases.

According to the third embodiment, by using the transistor 200 of the second embodiment as a switching transistor of a DRAM, a semiconductor memory in which the fluctuation of the threshold voltage after the heat treatment is reduced and having high heat resistance is provided.

Fourth Embodiment

Figure 11:
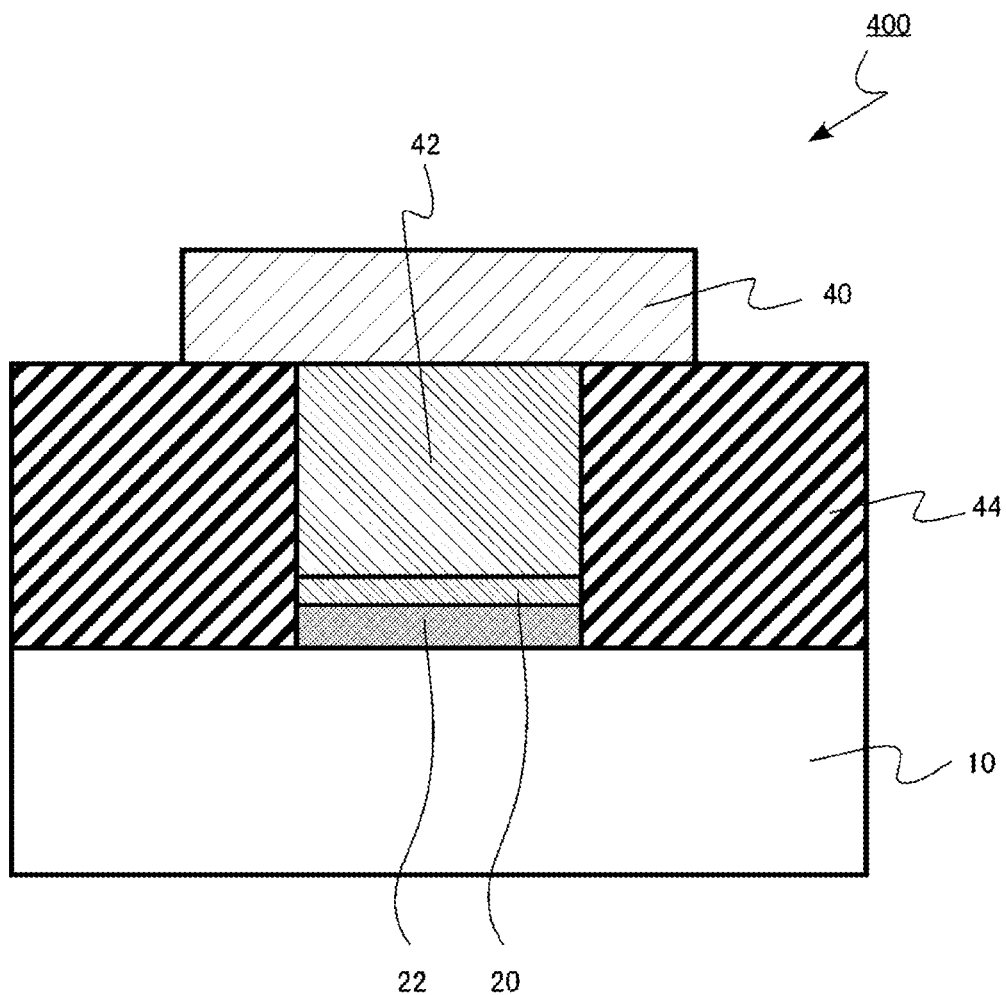
FIG. 11 is a schematic cross-sectional view of a semiconductor device of a fourth embodiment.

FIG. 11 is a schematic cross-sectional view of the semiconductor device of a fourth embodiment.

The semiconductor device of the fourth embodiment includes a contact structure 400. The contact structure 400 includes an oxide semiconductor layer 10, a barrier layer 20, a contact layer 22, a wiring layer 40, a contact plug 42, and an interlayer insulating layer 44.

The oxide semiconductor layer 10 is made of an oxide semiconductor. The oxide semiconductor layer 10 is made of a metal oxide. The oxide semiconductor layer 10 has, for example, an amorphous structure.

The oxide semiconductor layer 10 includes, for example, indium (In), zinc (Zn), and at least one of gallium (Ga) and aluminum (Al). The ratio of the total atomic concentration of indium, gallium, aluminum, and zinc to the total atomic concentration of the metal elements contained in the oxide semiconductor layer 10 is, for example, 90% or more. The ratio of the total atomic concentration of indium, gallium, aluminum, and zinc to the total atomic concentration of elements other than oxygen contained in the oxide semiconductor layer 10 is, for example, 90% or more. For example, in the oxide semiconductor layer 10, there is no element other than oxygen having an atomic concentration higher than any one of indium, gallium, aluminum, or zinc.

The wiring layer 40 is made of, for example, a metal or a metal compound.

The contact plug 42 is provided between the oxide semiconductor layer 10 and the wiring layer 40.

The contact plug 42 is made of, for example, a metal or a metal compound. The contact plug 42 is made of, for example, a metal having a chemical composition different from that of the barrier layer 20.

The contact plug 42 is made of, for example, titanium, titanium nitride, tungsten, tungsten nitride, copper, aluminum, tantalum, tantalum nitride, or molybdenum.

The barrier layer 20 is provided between the oxide semiconductor layer 10 and the contact plug 42. The barrier layer 20 is in contact with, for example, the contact plug 42. The barrier layer 20 functions as a diffusion barrier for oxygen diffused from the oxide semiconductor layer 10 to the contact plug 42 side.

The barrier layer 20 includes aluminum (Al), nitrogen (N), and at least one metal element selected from the group consisting of titanium (Ti), vanadium (V), zirconium (Zr), niobium (Nb), and chromium (Cr). Among the atomic concentrations of elements other than aluminum (Al) and nitrogen (N) included in the barrier layer 20, the atomic concentration of the at least one metal element is the highest. Hereinafter, the at least one metal element described above will be simply described as a metal element.

The barrier layer 20 is made of a nitride of the at least one metal element containing aluminum (Al).

The ratio of the atomic concentration of aluminum to the sum of the atomic concentration of the metal element and the atomic concentration of aluminum in the barrier layer 20 is, for example, 10% or more and 50% or less.

The thickness of the barrier layer 20 is less than the thickness of the contact layer 22 in the direction from the oxide semiconductor layer 10 to the source electrode 16, for example.

The thickness of the barrier layer 20 is, for example, one-half or less of the thickness of the contact layer 22. The thickness of the barrier layer 20 is, for example, 1 nm to 10 nm.

The barrier layer 20 includes a first titanium high concentration portion 20a, a first aluminum high concentration portion 20b, a second titanium high concentration portion 20c, a second aluminum high concentration portion 20d, and a third titanium high concentration portion 20e.

The contact layer 22 is provided between the oxide semiconductor layer 10 and the barrier layer 20. The contact layer 22 is in contact with, for example, the barrier layer 20 and/or the oxide semiconductor layer 10.

The contact layer 22 has the function of reducing the electrical resistance between the oxide semiconductor layer 10 and the contact plug 42.

The contact layer 22 includes oxygen (O) and at least one element selected from the group consisting of indium (In), zinc (Zn), tin (Sn), and cadmium (Cd). That is, the contact layer 22 is made of an oxide.

The contact layer 22 includes, for example, indium (In) and tin (Sn). The contact layer 22 is made of, for example, an oxide containing indium (In) and tin (Sn).

The contact layer 22 is, for example, thicker than the barrier layer 20 in the direction from the oxide semiconductor layer 10 to the contact plug 42.

The thickness of the contact layer 22 is, for example, twice or more the thickness of the barrier layer 20. The thickness of the contact layer 22 is, for example, 5 nm to 30 nm.

The interlayer insulating layer 44 is provided between the oxide semiconductor layer 10 and the wiring layer 40. The interlayer insulating layer 44 is made of, for example, silicon oxide, silicon nitride, or silicon oxynitride.

When the contact structure 400 does not include the barrier layer 20, the contact plug 42 is oxidized by the heat treatment applied after the contact structure 400 is formed. That is, oxygen contained in the oxide semiconductor layer 10 diffuses into the contact plug 42, and the metal configuring the contact plug 42 is oxidized to form a metal oxide layer.

The formation of the metal oxide layer between the oxide semiconductor layer 10 and the contact plug 42 increases the contact resistance between the oxide semiconductor layer 10 and the contact plug 42.

The contact structure 400 includes the barrier layer 20 between the oxide semiconductor layer 10 and the contact plug 42. By providing the barrier layer 20, oxidation of the contact plug 42 is prevented. Therefore, an increase in contact resistance between the oxide semiconductor layer 10 and the contact plug 42 is reduced.

Further, the contact structure 400 includes the contact layer 22 between the oxide semiconductor layer 10 and the barrier layer 20. Therefore, the contact resistance between the oxide semiconductor layer 10 and the contact plug 42 is reduced.

As described above, according to the fourth embodiment, a semiconductor device in which an increase in contact resistance after heat treatment is reduced and having high heat resistance is provided.

Fifth Embodiment

In a semiconductor device of the fifth embodiment, the gate electrode 12 surrounds the oxide semiconductor layer 10. The semiconductor device of the fifth embodiment is different from the semiconductor device of the second embodiment in that the material of the barrier layer is different.

Figure 12:
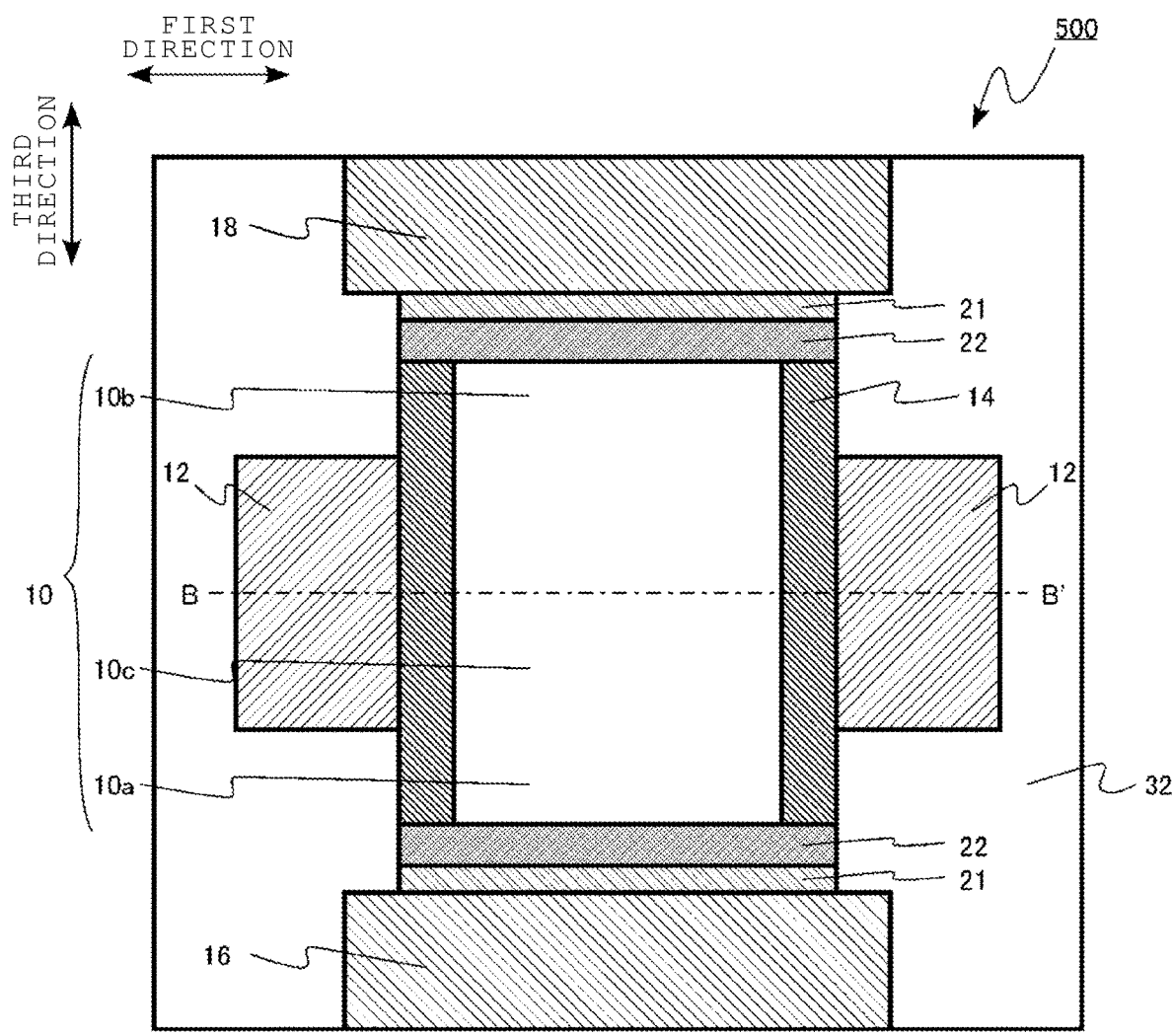
FIG. 12 is a schematic cross-sectional view of a semiconductor device of a fifth embodiment.
Figure 13:
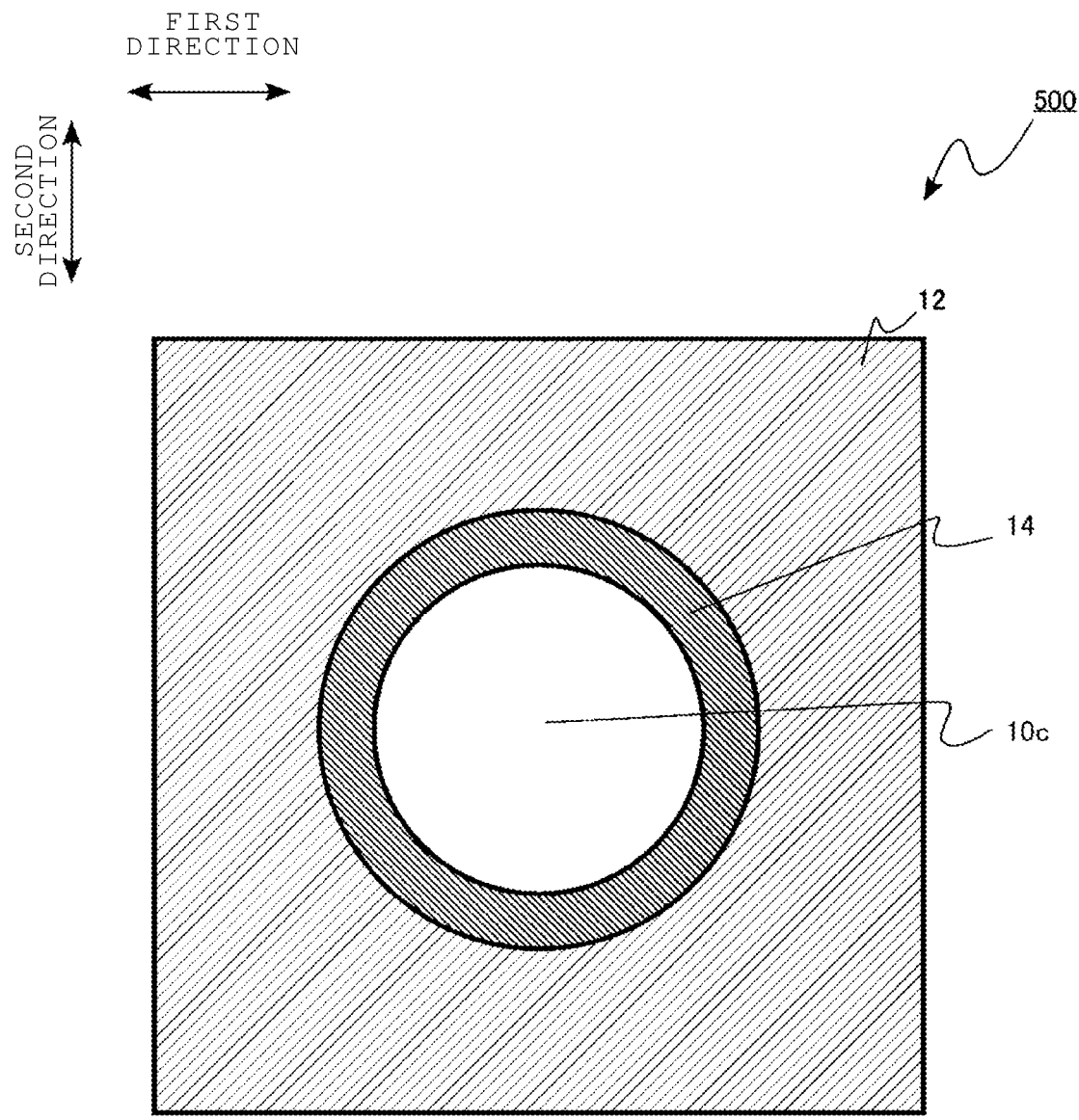
FIG. 13 is a schematic cross-sectional view of a semiconductor device of a fifth embodiment.

FIGS. 12 and 13 are schematic cross-sectional views of the semiconductor device of the fifth embodiment. FIG. 13 is a cross-sectional view taken along the line BB' of FIG. 12. In FIG. 12, the horizontal direction is referred to as a first direction, the depth direction is referred to as a second direction, and the vertical direction is referred to as a third direction.

The semiconductor device of the fifth embodiment is a transistor 500. The transistor 500 is an oxide semiconductor transistor in which a channel is formed. The transistor 500 is a so-called Surrounding Gate Transistor (SGT) in which a gate electrode surrounds an oxide semiconductor layer on which a channel is formed. The transistor 500 is a so-called vertical transistor.

The transistor 500 includes the oxide semiconductor layer 10, the gate electrode 12, a gate insulating layer 14, a source electrode 16, a drain electrode 18, a barrier layer 21, a contact layer 22, and an interlayer insulating layer 32.

The oxide semiconductor layer 10 is provided between the source electrode 16 and the drain electrode 18. A channel serving as a current path when the transistor 500 is turned on is formed in the oxide semiconductor layer 10. The oxide semiconductor layer 10 extends along the third direction. The oxide semiconductor layer 10 has a columnar shape extending along the third direction. The oxide semiconductor layer 10 is, for example, cylindrical.

The direction in which electrons flow in the channel is called the channel length direction. The third direction is the channel length direction of the transistor 500.

The oxide semiconductor layer 10 is made of an oxide semiconductor. The oxide semiconductor layer 10 is made of a metal oxide. The oxide semiconductor layer 10 has, for example, an amorphous structure.

The oxide semiconductor layer 10 includes, for example, indium (In), zinc (Zn), and at least one of gallium (Ga) and aluminum (Al). The ratio of the total atomic concentration of indium, gallium, and zinc to the total atomic concentration of the metal elements contained in the oxide semiconductor layer 10 is, for example, 90% or more. The ratio of the total atomic concentration of indium, gallium, aluminum, and zinc to the total atomic concentration of elements other than oxygen contained in the oxide semiconductor layer 10 is, for example, 90% or more. For example, in the oxide semiconductor layer 10, there is no element other than oxygen having an atomic concentration higher than any of indium, gallium, aluminum, or zinc.

The oxide semiconductor layer 10 includes a first region 10a, a second region 10b, and a third region 10c. The third region 10c is a region between the first region 10a and the second region 10b.

The oxide semiconductor layer 10 contains, for example, oxygen deficiency. The oxygen deficiency in the oxide semiconductor layer 10 functions as a donor.

The width of the oxide semiconductor layer 10 in the first direction is, for example, 20 nm to 100 nm. The length of the oxide semiconductor layer 10 in the third direction is, for example, 80 nm to 200 nm.

The gate electrode 12 surrounds the oxide semiconductor layer 10. The gate electrode 12 is provided around the oxide semiconductor layer 10.

The gate electrode 12 is, for example, a metal, a metal compound, or a semiconductor. The gate electrode 12 is, for example, titanium nitride (TiN) or tungsten (W). The gate length of the gate electrode 12 is, for example, 20 nm to 100 nm.

The gate insulating layer 14 is provided between the oxide semiconductor layer 10 and the gate electrode 12. The gate insulating layer 14 surrounds the oxide semiconductor layer 10. The gate insulating layer 14 is provided between the third region 10c and the gate electrode 12.

The gate insulating layer 14 is made of, for example, an oxide or an oxynitride. The gate insulating layer 14 is made of, for example, silicon oxide or aluminum oxide. The thickness of the gate insulating layer 14 is, for example, 2 nm to 10 nm.

It is also possible to provide another oxide layer of a material different from that of the gate insulating layer 14 between the oxide semiconductor layer 10 and the gate insulating layer 14.

The source electrode 16 is provided below the oxide semiconductor layer 10. The source electrode 16 is provided below the first region 10a. The source electrode 16 is electrically connected to the first region 10a.

The source electrode 16 is made of, for example, a metal or a metal compound. The source electrode 16 is made of, for example, a metal having a chemical composition different from that of the barrier layer 21.

The source electrode 16 is made of, for example, titanium, titanium nitride, tungsten, tungsten nitride, copper, aluminum, tantalum, tantalum nitride, or molybdenum.

The drain electrode 18 is provided on the oxide semiconductor layer 10. The drain electrode 18 is provided above the second region 10b. The drain electrode 18 is electrically connected to the second region 10b.

The drain electrode 18 is made of, for example, titanium, titanium nitride, tungsten, tungsten nitride, copper, aluminum, tantalum, tantalum nitride, or molybdenum.

The barrier layer 21 is provided between the oxide semiconductor layer 10 and the source electrode 16. More specifically, the barrier layer 21 is provided between the first region 10a and the source electrode 16. The barrier layer 21 is in contact with, for example, the source electrode 16. The barrier layer 21 functions as a diffusion barrier for oxygen diffused from the oxide semiconductor layer 10 to the source electrode 16 side.

The barrier layer 21 is also provided between the oxide semiconductor layer 10 and the drain electrode 18. More specifically, the barrier layer 21 is provided between the second region 10b and the drain electrode 18. The barrier layer 21 is in contact with, for example, the drain electrode 18. The barrier layer 21 functions as a diffusion barrier for oxygen diffused from the oxide semiconductor layer 10 to the drain electrode 18 side.

The barrier layer 21 includes oxygen (O) and at least one of rhodium (Rh) and iridium (Ir). Among the atomic concentrations of elements other than oxygen (O) included in the barrier layer 21, the atomic concentration of rhodium (Rh) or iridium (Ir) is the highest.

The barrier layer 21 is made of an oxide. The barrier layer 21 comprises, for example, rhodium oxide or iridium oxide. The barrier layer 21 is made of, for example, rhodium oxide or iridium oxide.

The thickness of the barrier layer 21 is, for example, one-half or less of the thickness of the contact layer 22. The thickness of the barrier layer 21 is, for example, 1 nm to 10 nm.

The contact layer 22 is provided between the oxide semiconductor layer 10 and the barrier layer 21. The contact layer 22 is provided between the first region 10a and the source electrode 16 and between the second region 10b and the drain electrode 18.

The contact layer 22 is in contact with, for example, the barrier layer 21. The contact layer 22 is in contact with, for example, the oxide semiconductor layer 10. The contact layer 22 is in contact with, for example, the first region 10a. The contact layer 22 is in contact with, for example, the second region 10b.

The contact layer 22 has the function of reducing the resistance between the first region 10a and the source electrode 16 and between the second region 10b and the drain electrode 18.

The contact layer 22 includes oxygen (O) and at least one element selected from the group consisting of indium (In), zinc (Zn), tin (Sn), and cadmium (Cd). That is, the contact layer 22 is made of an oxide.

The contact layer 22 includes, for example, indium (In) and tin (Sn). The contact layer 22 is made of, for example, an oxide containing indium (In) and tin (Sn).

The contact layer 22 is, for example, thicker than the barrier layer 21 in the direction from the oxide semiconductor layer 10 to the source electrode 16.

The thickness of the contact layer 22 is, for example, at least twice the thickness of the barrier layer 21. The thickness of the contact layer 22 is, for example, 5 nm to 30 nm.

The interlayer insulating layer 32 surrounds the gate electrode 12, the source electrode 16, and the drain electrode 18. The interlayer insulating layer 32 is made of, for example, an oxide, a nitride, or an oxynitride. The interlayer insulating layer 32 is made of, for example, silicon oxide, silicon nitride, or silicon oxynitride.

The transistor 500 of the fifth embodiment includes a barrier layer 21 that prevents the diffusion of oxygen between the oxide semiconductor layer 10 and the source electrode 16 and also between the oxide semiconductor layer 10 and the drain electrode 18. By providing the barrier layer 21, oxygen in the oxide semiconductor layer 10 is prevented from escaping to the side of the source electrode 16 and the drain electrode 18. Therefore, the fluctuation of the threshold voltage of the transistor 500 is reduced.

As described above, according to the fifth embodiment, an oxide semiconductor transistor in which the fluctuation of the threshold voltage after the heat treatment is reduced and having high heat resistance is provided. Further, according to the fifth embodiment, the SGT makes it possible to provide the transistors at a high density per unit area.

It is also possible to form a bottom gate type transistor by the barrier layer 21 of the fifth embodiment in place of the barrier layer 20 of the first embodiment. It is also possible to implement a semiconductor memory using the barrier layer 21 of the fifth embodiment in place of the barrier layer 20 of the third embodiment. It is also possible to implement a contact structure using the barrier layer 21 of the fifth embodiment in place of the barrier layer 20 of the fourth embodiment.

In the first to fourth embodiments, a transistor in which the barrier layer 20 and the contact layer 22 are located between the first region 10a and the source electrode 16 and between the second region 10b and the drain electrode 18 is described as an example. However, a transistor in which the barrier layer 20 and the contact layer 22 are provided only at one of the positions between the first region 10a and the source electrode 16 and between the second region 10b and the drain electrode 18 is also possible.

In the first to fifth embodiments, the case where the oxide semiconductor layer 10 is a metal oxide including indium (In), zinc (Zn), and at least one of gallium (Ga) and aluminum (Al) has been described as an example. However, it is also possible to use other metal oxides for the oxide semiconductor layer 10.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   an oxide semiconductor layer having a first region, a second region, and a third region between the first region and the second region;
   a gate electrode;
   a gate insulating layer between the third region and the gate electrode;
   a first electrode electrically connected to the first region;
   a second electrode electrically connected to the second region;
   a first conductive layer at least between the first region and the first electrode or between the second region and the second electrode, the first conductive layer comprising aluminum, nitrogen, and a metal element selected from a group consisting of titanium, vanadium, zirconium, niobium, and chromium, the first conductive layer including first, second, and third portions that are arranged along a first direction, the first portion being between the second portion and the oxide semiconductor layer, and the second portion being between the first and third portions; and
   a second conductive layer between the oxide semiconductor layer and the first conductive layer, the second conductive layer comprising oxygen and at least one element selected from a group consisting of indium, zinc, tin, and cadmium, wherein an atomic concentration of the metal element in the first portion is higher than an atomic concentration of aluminum in the first portion, an atomic concentration of aluminum in the second portion is higher than an atomic concentration of the metal element in the second portion, and an atomic concentration of the metal element in the third portion is higher than an atomic concentration of aluminum in the third portion.

2. The semiconductor device according to claim 1, wherein
the first conductive layer further includes a fourth portion in which an atomic concentration of aluminum is higher than an atomic concentration of the metal element, and
the third portion is between the second and fourth portions.

3. The semiconductor device according to claim 1, wherein a ratio of an atomic concentration of aluminum in the first conductive layer to a sum of atomic concentrations of the metal element and aluminum in the first conductive layer is 50% or less.

4. The semiconductor device according to claim 1, wherein a thickness of the first conductive layer is less than a thickness of the second conductive layer in the first direction.

5. The semiconductor device according to claim 1, wherein a thickness of the first conductive layer in the first direction is 10 nm or less.

6. The semiconductor device according to claim 1, wherein
a thickness of the first portion in the first direction is 0.5 nm or less, and
a thickness of the second portion in the first direction is 0.5 nm or less.

7. The semiconductor device according to claim 1, wherein the oxide semiconductor layer includes indium, zinc, and at least one of gallium and aluminum.

8. The semiconductor device according to claim 1, wherein the gate electrode surrounds the oxide semiconductor layer.

9. A semiconductor device, comprising:
an oxide semiconductor layer having a first region, a second region, and a third region between the first region and the second region;
a gate electrode;
a gate insulating layer between the third region and the gate electrode;
a first electrode electrically connected to the first region;
a second electrode electrically connected to the second region;
a first conductive layer at least between the first region and the first electrode or between the second region and the second electrode, the first conductive layer comprising aluminum, nitrogen, and a metal element selected from a group consisting of titanium, vanadium, zirconium, niobium, and chromium and including a first portion and a second portion adjacent in a first direction; and
a second conductive layer between the oxide semiconductor layer and the first conductive layer, the second conductive layer comprising oxygen and at least one element selected from a group consisting of indium, zinc, tin, and cadmium, wherein
an atomic concentration of the metal element in the first portion is higher than an atomic concentration of aluminum in the first portion, and
an atomic concentration of aluminum in the second portion is higher than an atomic concentration of the metal element in the second portion, and
the first portion is in contact with the second conductive layer.

10. The semiconductor device according to claim 9, wherein a ratio of an atomic concentration of aluminum in the first conductive layer to a sum of atomic concentrations of the metal element and aluminum in the first conductive layer is 50% or less.

11. The semiconductor device according to claim 9, wherein
a thickness of the first portion in the first direction is 0.5 nm or less, and
a thickness of the second portion in the first direction is 0.5 nm or less.

12. The semiconductor device according to claim 9, wherein the oxide semiconductor layer includes indium, zinc, and at least one of gallium and aluminum.

13. The semiconductor device according to claim 9, wherein the gate electrode surrounds the oxide semiconductor layer.

14. A semiconductor storage device, comprising:
a first wiring extending along a first direction;
a second wiring extending along a second direction intersecting the first direction; and
a memory cell including:
an oxide semiconductor layer having a first region, a second region, and a third region between the first region and the second region arranged along a third direction intersecting each of the first and second directions, wherein the first region is electrically connected to the first wiring, and the third region is surrounded by at least a part of the second wiring,
a gate insulating layer between the third region and the part of the second wiring,
a capacitor electrically connected to the second region,
a first conductive layer at least between the first region and the first wiring or between the second region and the capacitor, the first conductive layer comprising aluminum, nitrogen, and a metal element selected from a group consisting of titanium, vanadium, zirconium, niobium, and chromium and including a first portion and a second portion adjacent in the third direction, and
a second conductive layer between the oxide semiconductor layer and the first conductive layer, the second conductive layer comprising oxygen and at least one element selected from a group consisting of indium, zinc, tin, and cadmium, wherein
an atomic concentration of the metal element in the first portion is higher than an atomic concentration of aluminum in the first portion, and
an atomic concentration of aluminum in the second portion is higher than an atomic concentration of the metal element in the second portion.

15. The semiconductor storage device according to claim 14, wherein a ratio of an atomic concentration of aluminum in the first conductive layer to a sum of atomic concentrations of the metal element and aluminum in the first conductive layer is 50% or less.

16. The semiconductor storage device according to claim 14, wherein the first portion is between the second portion and the oxide semiconductor layer.

17. The semiconductor storage device according to claim 16, wherein the first conductive layer further includes a third portion in which an atomic concentration of the metal element is higher than an atomic concentration of aluminum, and the second portion is between the first and third portions.

18. The semiconductor storage device according to claim 17, wherein the first conductive layer further includes a fourth portion in which an atomic concentration of aluminum is higher than an atomic concentration of the metal element, and the third portion is between the second and fourth portions.

19. A semiconductor device, comprising:

an oxide semiconductor layer;

an electrode electrically connected to the oxide semiconductor layer;

a first conductive layer between the oxide semiconductor layer and the electrode, the first conductive layer comprising aluminum, nitrogen, and a metal element selected from a group consisting of titanium, vanadium, zirconium, niobium, and chromium, the first conductive layer including first, second, and third portions that are arranged along a first direction, the first portion being between the second portion and the oxide semiconductor layer, and the second portion being between the first and third portions; and a second conductive layer between the oxide semiconductor layer and the first conductive layer, the second conductive layer comprising oxygen and at least one element selected from a group consisting of indium, zinc, tin, and cadmium, wherein an atomic concentration of the metal element in the first portion is higher than an atomic concentration of aluminum in the first portion, an atomic concentration of aluminum in the second portion is higher than an atomic concentration of the metal element in the second portion, and an atomic concentration of the metal element in the third portion is higher than an atomic concentration of aluminum in the third portion.

20. The semiconductor device according to claim 19, wherein the first conductive layer further includes a fourth portion in which an atomic concentration of aluminum is higher than an atomic concentration of the metal element, and the third portion is between the second and fourth portions.

* * * * *